US 10,746,818 B2

(12) United States Patent
Cesaretti

(10) Patent No.: US 10,746,818 B2
(45) Date of Patent: Aug. 18, 2020

(54) SYSTEMS AND METHODS FOR REDUCING HIGH ORDER HALL PLATE SENSITIVITY TEMPERATURE COEFFICIENTS

(71) Applicant: Allegro MicroSystems, LLC, Manchester, NH (US)

(72) Inventor: Juan Manuel Cesaretti, Ciudad de Buenos Aires (AR)

(73) Assignee: Allegro MicroSystems, LLC, Manchester, NH (US)

(*) Notice: Subject to any disclaimer, the term of this patent is extended or adjusted under 35 U.S.C. 154(b) by 64 days.

(21) Appl. No.: 16/156,104

(22) Filed: Oct. 10, 2018

(65) Prior Publication Data
US 2019/0049528 A1 Feb. 14, 2019

Related U.S. Application Data

(62) Division of application No. 15/207,903, filed on Jul. 12, 2016, now Pat. No. 10,162,017.

(51) Int. Cl.
G01R 33/00 (2006.01)
G01R 33/07 (2006.01)

(52) U.S. Cl.
CPC ..... *G01R 33/0082* (2013.01); *G01R 33/0029* (2013.01); *G01R 33/07* (2013.01)

(58) Field of Classification Search
CPC . G01R 33/0082; G01R 33/0029; G01R 33/07
(Continued)

(56) References Cited

U.S. PATENT DOCUMENTS 4,236,832 A 12/1980 Komatsu et al.
4,345,477 A 8/1982 Johnson
(Continued)

FOREIGN PATENT DOCUMENTS

CN 1501093 A 6/2004
CN 1714458 A 1/2005
(Continued)

OTHER PUBLICATIONS

Communication under Rule 71(3) EPC dated Feb. 22, 2019 for European Application No. 17180353.9; 7 Pages.
(Continued)

*Primary Examiner* — Patrick Assouad
*Assistant Examiner* — Sean Curtis
(74) *Attorney, Agent, or Firm* — Daly, Crowley, Mofford & Durkee, LLP

(57) ABSTRACT

The systems and methods described can reduce high order temperature coefficients on the Hall plate sensitivity. A temperature coefficient circuit may include a first amplifier to receive a first reference voltage generated in conjunction with a proportional to absolute temperature (PTAT) device and a second amplifier to receive a second reference voltage generated in conjunction with a complementary to absolute temperature (CTAT) device, the second amplifier having a second output node. A plurality of resistors may be disposed in a signal path between output node of the first amplifier and an output node of the second amplifier. The plurality of resistors may be coupled to at least one voltage-to-current converter through one or more resistors taps. The voltage-to-current converter may generate at least one current signal that can be operable to apply a multiplication factor or a division divisor to an amplifier coupled to the voltage-to-current converter.

20 Claims, 8 Drawing Sheets

(58) Field of Classification Search
USPC .................................................. 324/225
See application file for complete search history.

(56) References Cited

U.S. PATENT DOCUMENTS

| | | | |
|---|---|---|---|
| 4,430,895 A | 2/1984 | Colton | |
| 4,438,347 A | 3/1984 | Gehring | |
| 4,521,727 A * | 6/1985 | Atherton | G01D 3/036 |
| | | | 323/294 |
| 4,703,663 A | 11/1987 | Oppermann | |
| 4,734,594 A * | 3/1988 | Nelson | H03K 17/90 |
| | | | 323/368 |
| 4,752,733 A | 6/1988 | Petr et al. | |
| 4,758,943 A | 7/1988 | Aström et al. | |
| 4,760,285 A * | 7/1988 | Nelson | H01L 27/22 |
| | | | 257/421 |
| 4,823,075 A | 4/1989 | Alley | |
| 4,833,406 A | 5/1989 | Foster | |
| 4,857,842 A * | 8/1989 | Sturman | G01B 7/003 |
| | | | 324/225 |
| 4,965,762 A | 10/1990 | Williams | |
| 4,970,411 A | 11/1990 | Halg et al. | |
| 4,987,781 A | 1/1991 | Reimann | |
| 5,055,768 A * | 10/1991 | Plagens | G01D 3/0365 |
| | | | 323/368 |
| 5,135,062 A | 8/1992 | Lockery et al. | |
| 5,247,278 A | 9/1993 | Pant et al. | |
| 5,285,155 A | 2/1994 | Ueda et al. | |
| 5,329,416 A | 7/1994 | Ushiyama et al. | |
| 5,343,143 A | 8/1994 | Voisine et al. | |
| 5,412,255 A | 5/1995 | Wallrafen | |
| 5,424,558 A | 6/1995 | Borden et al. | |
| 5,469,058 A | 11/1995 | Dunnam | |
| 5,521,501 A | 5/1996 | Dettmann et al. | |
| 5,614,754 A | 3/1997 | Inoue | |
| 5,621,319 A | 4/1997 | Bilotti et al. | |
| 5,640,090 A | 6/1997 | Furuya et al. | |
| 5,652,445 A | 7/1997 | Johnson | |
| 5,734,703 A | 3/1998 | Hiyoshi | |
| 5,844,140 A | 12/1998 | Seale | |
| 6,011,770 A | 1/2000 | Tan | |
| 6,023,978 A | 2/2000 | Dauenhauer et al. | |
| 6,104,231 A * | 8/2000 | Kirkpatrick, II | G01R 33/07 |
| | | | 327/378 |
| 6,232,832 B1 * | 5/2001 | Kirkpatrick, II | G06G 7/25 |
| | | | 327/309 |
| 6,351,506 B1 | 2/2002 | Lewicki | |
| 6,362,618 B1 | 3/2002 | Motz | |
| 6,392,478 B1 | 5/2002 | Mulder et al. | |
| 6,433,615 B2 * | 8/2002 | Nagano | G01D 3/02 |
| | | | 327/513 |
| 6,436,748 B1 | 8/2002 | Forbes et al. | |
| 6,437,558 B2 | 8/2002 | Li et al. | |
| 6,441,460 B1 | 8/2002 | Viebach | |
| 6,639,290 B1 | 10/2003 | Hohe et al. | |
| 6,750,644 B1 | 6/2004 | Berkcan | |
| 6,825,709 B2 * | 11/2004 | Motz | G01R 33/07 |
| | | | 327/513 |
| 6,853,178 B2 | 2/2005 | Hayat-Dawoodi | |
| 6,896,407 B2 | 2/2005 | Nomiyama et al. | |
| 6,917,321 B1 | 7/2005 | Haurie et al. | |
| 6,973,836 B2 | 12/2005 | Katsumata et al. | |
| 6,991,367 B2 | 1/2006 | Adlerstein | |
| 7,038,448 B2 | 5/2006 | Schott et al. | |
| 7,088,085 B2 * | 8/2006 | Marinca | G05F 3/30 |
| | | | 323/314 |
| 7,190,784 B2 | 3/2007 | Li | |
| 7,259,545 B2 | 8/2007 | Stauth et al. | |
| 7,292,095 B2 | 11/2007 | Burt et al. | |
| 7,319,319 B2 | 1/2008 | Jones et al. | |
| 7,323,870 B2 | 1/2008 | Tatschl et al. | |
| 7,325,175 B2 | 1/2008 | Momtaz | |
| 7,339,245 B2 | 3/2008 | Mueller | |
| 7,345,470 B2 | 3/2008 | Suzuki | |
| 7,425,821 B2 | 9/2008 | Monreal et al. | |
| 7,474,093 B2 | 1/2009 | Ausserlechner | |
| 7,495,505 B2 * | 2/2009 | Chang | G05F 3/30 |
| | | | 323/313 |
| 7,518,354 B2 | 4/2009 | Stauth et al. | |
| 7,598,601 B2 | 10/2009 | Taylor et al. | |
| 7,605,647 B1 | 10/2009 | Romero et al. | |
| 7,635,993 B2 | 12/2009 | Boeve | |
| 7,694,200 B2 | 4/2010 | Forrest et al. | |
| 7,701,208 B2 | 4/2010 | Nishikawa | |
| 7,729,675 B2 | 6/2010 | Krone | |
| 7,746,056 B2 | 6/2010 | Stauth et al. | |
| 7,746,065 B2 | 6/2010 | Pastre et al. | |
| 7,764,118 B2 | 7/2010 | Kusuda et al. | |
| 7,769,110 B2 | 8/2010 | Momtaz | |
| 7,800,389 B2 | 9/2010 | Friedrich et al. | |
| 7,872,322 B2 | 1/2011 | Schott et al. | |
| 7,923,996 B2 | 4/2011 | Doogue et al. | |
| 7,936,029 B2 | 5/2011 | Wang | |
| 7,936,144 B2 | 5/2011 | Vig et al. | |
| 7,961,823 B2 | 6/2011 | Kolze et al. | |
| 7,980,138 B2 | 7/2011 | Ausserlechner | |
| 7,982,454 B2 | 7/2011 | Fernandez et al. | |
| 7,990,209 B2 | 8/2011 | Romero | |
| 8,030,918 B2 | 10/2011 | Doogue et al. | |
| 8,128,549 B2 | 3/2012 | Testani et al. | |
| 8,134,358 B2 | 3/2012 | Charlier et al. | |
| 8,203,102 B2 | 6/2012 | Nakano et al. | |
| 8,203,329 B2 | 6/2012 | Hohe et al. | |
| 8,215,177 B2 | 7/2012 | Hayner et al. | |
| 8,262,286 B2 * | 9/2012 | Peterson | G01K 7/01 |
| | | | 327/512 |
| 8,299,783 B2 | 10/2012 | Fernandez et al. | |
| 8,357,983 B1 | 1/2013 | Wang | |
| 8,447,556 B2 | 5/2013 | Friedrich et al. | |
| 8,451,047 B2 * | 5/2013 | Chen | G01K 3/10 |
| | | | 327/512 |
| 8,514,020 B2 * | 8/2013 | Collins, III | H03F 1/3211 |
| | | | 330/151 |
| 8,542,010 B2 | 9/2013 | Cesaretti et al. | |
| 8,596,864 B2 * | 12/2013 | Peterson | G01K 7/01 |
| | | | 374/170 |
| 8,616,065 B2 | 12/2013 | Stewart et al. | |
| 8,618,821 B2 | 12/2013 | Fornara et al. | |
| 8,680,846 B2 | 3/2014 | Cesaretti et al. | |
| 8,680,848 B2 | 3/2014 | Foletto et al. | |
| 8,692,546 B2 | 4/2014 | Cesaretti et al. | |
| 8,723,515 B2 * | 5/2014 | Motz | G01R 33/0029 |
| | | | 324/251 |
| 8,818,749 B2 | 8/2014 | Friedrich et al. | |
| 8,890,518 B2 | 11/2014 | Daubert | |
| 9,003,897 B2 | 4/2015 | Wade et al. | |
| 9,016,135 B2 * | 4/2015 | Huber | G01D 3/0365 |
| | | | 257/414 |
| 9,121,896 B2 | 9/2015 | Fornara et al. | |
| 9,312,473 B2 | 4/2016 | Kosier et al. | |
| 9,322,840 B2 | 4/2016 | Ausserlechner | |
| 9,638,764 B2 | 5/2017 | Cesaretti et al. | |
| 9,753,097 B2 | 9/2017 | Romero | |
| 9,766,300 B2 * | 9/2017 | Motz | G01R 33/0029 |
| 9,851,417 B2 | 12/2017 | Kosier et al. | |
| 9,857,437 B2 | 1/2018 | Taylor et al. | |
| 9,864,038 B2 * | 1/2018 | Fujita | G01R 33/07 |
| 9,929,141 B2 | 3/2018 | Kuo et al. | |
| 10,107,873 B2 | 10/2018 | Cesaretti | |
| 10,162,017 B2 * | 12/2018 | Cesaretti | G01R 33/07 |
| 10,234,889 B2 * | 3/2019 | Arnold | G05F 3/267 |
| 10,520,559 B2 * | 12/2019 | Cesaretti | G01R 33/077 |
| 2002/0084923 A1 | 7/2002 | Li | |
| 2002/0100948 A1 | 8/2002 | Yoshihara et al. | |
| 2003/0038675 A1 | 2/2003 | Gailus et al. | |
| 2003/0102909 A1 | 6/2003 | Motz | |
| 2004/0032246 A1 | 2/2004 | Motz | |
| 2005/0001605 A1 * | 1/2005 | Marinca | G05F 3/30 |
| | | | 323/314 |
| 2005/0265898 A1 | 12/2005 | Bell et al. | |
| 2006/0202692 A1 | 9/2006 | Tatschl et al. | |
| 2007/0018655 A1 | 1/2007 | Ausserlechner et al. | |

(56) References Cited

U.S. PATENT DOCUMENTS

| | | | |
|---|---|---|---|
| 2007/0110199 A1 | 5/2007 | Momtaz et al. | |
| 2007/0222433 A1 | 9/2007 | Tiernan et al. | |
| 2007/0247141 A1 | 10/2007 | Pastre et al. | |
| 2007/0263700 A1 | 11/2007 | Moelkner et al. | |
| 2007/0265898 A1 | 11/2007 | Naono et al. | |
| 2007/0285089 A1 | 12/2007 | Ibuki et al. | |
| 2008/0018319 A1* | 1/2008 | Chang | G05F 3/30 323/315 |
| 2008/0110987 A1 | 5/2008 | Cato et al. | |
| 2008/0137784 A1 | 6/2008 | Krone | |
| 2008/0238410 A1 | 10/2008 | Charlier et al. | |
| 2008/0265880 A1 | 10/2008 | Nishikawa | |
| 2009/0001964 A1 | 1/2009 | Strzalkowski | |
| 2009/0029668 A1 | 1/2009 | Hsieh et al. | |
| 2009/0085706 A1 | 4/2009 | Baarman et al. | |
| 2009/0108839 A1 | 4/2009 | Ausserlechner | |
| 2009/0256559 A1 | 10/2009 | Ausserlechner et al. | |
| 2010/0045362 A1 | 2/2010 | Dribinsky et al. | |
| 2010/0117638 A1 | 5/2010 | Yamashita et al. | |
| 2010/0117715 A1 | 5/2010 | Ariyama | |
| 2010/0124251 A1* | 5/2010 | Peterson | G01K 7/01 374/171 |
| 2010/0315108 A1 | 12/2010 | Fornara et al. | |
| 2011/0080933 A1 | 4/2011 | Rivero | |
| 2011/0158286 A1* | 6/2011 | Peterson | G01K 7/01 374/170 |
| 2011/0298453 A1 | 12/2011 | Kura et al. | |
| 2011/0316515 A1* | 12/2011 | Mitsuda | H03L 1/04 323/314 |
| 2012/0016614 A1 | 1/2012 | Hohe et al. | |
| 2012/0112695 A1 | 5/2012 | Nishi et al. | |
| 2012/0210800 A1* | 8/2012 | Huber | G01D 3/0365 73/777 |
| 2012/0293238 A1* | 11/2012 | Chen | G01K 3/10 327/512 |
| 2012/0313635 A1 | 12/2012 | Daubert | |
| 2013/0049869 A1* | 2/2013 | Collins, III | H03F 1/3211 330/295 |
| 2013/0057084 A1 | 3/2013 | Lee | |
| 2013/0093412 A1 | 4/2013 | Anelli et al. | |
| 2013/0285651 A1 | 10/2013 | Wan et al. | |
| 2014/0009221 A1* | 1/2014 | Motz | G01R 33/077 327/564 |
| 2015/0028871 A1 | 1/2015 | Suijver et al. | |
| 2015/0115937 A1 | 4/2015 | Fujita et al. | |
| 2015/0316623 A1 | 11/2015 | Romero | |
| 2016/0241186 A1 | 8/2016 | Motz | |
| 2017/0147028 A1* | 5/2017 | Arnold | G05F 3/267 |
| 2017/0261306 A1 | 9/2017 | Ausserlechner | |
| 2017/0331429 A1 | 11/2017 | Motz | |
| 2018/0017637 A1* | 1/2018 | Cesaretti | G01R 33/07 |
| 2018/0026609 A1 | 1/2018 | Scilla | |
| 2019/0049528 A1* | 2/2019 | Cesaretti | G01R 33/0082 |

FOREIGN PATENT DOCUMENTS

| | | |
|---|---|---|
| CN | 101023367 A | 8/2007 |
| CN | 200986484 Y | 12/2007 |
| DE | 195 39 458 A1 | 4/1997 |
| DE | 196 06 826 A1 | 8/1997 |
| DE | 10 2005 047 413 A1 | 9/2006 |
| DE | 10 2006 037 226 A | 2/2008 |
| DE | 10 2007 041 230 B3 | 4/2009 |
| EP | 0289414 A2 | 11/1988 |
| EP | 0289414 A3 | 11/1988 |
| EP | 0338122 | 10/1989 |
| EP | 0357013 A2 | 3/1990 |
| EP | 1637898 A1 | 7/2006 |
| EP | 1679524 A1 | 7/2006 |
| EP | 1850143 A1 | 10/2007 |
| EP | 2 339 735 | 6/2011 |
| EP | 3279680 A2 * | 2/2018 | G01R 33/0082 |
| EP | 3279680 A3 * | 6/2018 | G01R 33/0082 |
| GB | 2276727 A | 10/1994 |
| JP | S 6148777 A | 3/1986 |
| JP | S 63-11675 Y2 | 4/1988 |
| JP | H03-176682 | 7/1991 |
| JP | H03-248611 A | 11/1991 |
| JP | 2000-55999 | 2/2000 |
| JP | 2002-213992 | 7/2002 |
| JP | 2004-177228 A | 6/2004 |
| JP | 2004-234589 A | 8/2004 |
| JP | 2006-126012 A | 5/2006 |
| JP | A 2006126012 A | 5/2006 |
| JP | 2008-513762 A | 5/2008 |
| JP | 2010-500536 A | 1/2010 |
| JP | 4840481 B2 | 1/2011 |
| JP | 2011-052036 A | 3/2011 |
| KR | 10-2007-0060096 A | 6/2007 |
| TW | 200640135 | 11/2006 |
| WO | WO 96/02849 A1 | 2/1996 |
| WO | WO 2004/072672 | 8/2004 |
| WO | WO 2006/035342 A1 | 4/2006 |
| WO | WO 2006/056829 | 6/2006 |
| WO | WO 2007/138508 A1 | 12/2007 |
| WO | WO 2008/048379 A1 | 4/2008 |
| WO | WO 2008/123144 A | 10/2008 |
| WO | WO 2009/108422 A2 | 9/2009 |
| WO | WO 2009/108422 A3 | 9/2009 |
| WO | WO 2010/096367 A1 | 8/2010 |
| WO | WO 2011/004250 A2 | 1/2011 |
| WO | WO 2011/011479 | 1/2011 |
| WO | WO 2012/013977 | 2/2012 |

OTHER PUBLICATIONS

U.S. Appl. No. 16/132,653, filed Sep. 17, 2018, Cesaretti.

"A Graphical Representation of the Piezoresistance Coefficients in Silicon" by Yozo Kanda; *IEEE* Transactions on Electron Devices, vol. Ed-29, No. 1, Jan. 1982; pp. 64-70 (7 pages).

"A miniature digital current sensor with differential Hall probes using enhanced chopping techniques and mechanical stress compensation" by Mario Motz et al., Infineon Technologies Austria AG; 2012 *IEEE* (4 pages).

"CMOS-Based Monolithic Controllers for Smart Sensors Comprising Micromembranes and Microcantilevers", Barrettino et al.; IEEE Transaction on Circuits and Systems—I. Regular Papers., vol. 54, No. 1, Jan. 2007; 12 pages.

"The piezo-Hall effect in n-silicon" by Yozo Kanda and Katuhisa Suzuki; vol. 1; 1995; pp. 89-92 (4 pages).

Ackermann et al.; "New Generation of Hall-effect Based Current Sensor: Evolution from Core-based to Integrated;" M. Sc. Laurent Coulot, Melexis Technologies, A.G.Bevaix; Apr. 1, 2015; 8 pages.

Allegro MicroSystems, LLC; A3981 Automotive, Programmable Stepper Driver; datasheet; Jan. 2013; 43 pages.

Allowed claims filed on Jun. 5, 2017 for JP Pat. Appl. No. 2015-013206; 2 pages.

Allowed Specification dated Sep. 14, 2018 for European Application No. 16716398.9; 33 Pages.

Amended to Claims filed May 9, 2018 for EP Pat. Appl. No. 16716398.9; 5 pages.

Amended to Specification filed May 9, 2018 for EP Pat. Appl. No. 16716398.9; 2 pages.

Amendment and Response to Restriction Requirement dated Mar. 2, 2018 for U.S. Appl. No. 15/207,903, filed Mar. 14, 2018; 11 pages.

Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; 8 pages.

Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; 4 pages.

Ausserlechner; "Limits of Offset Cancellation by the Principle of Spinning Current Hall Probe;" Proceedings of IEEE Sensors; Oct. 2004; 4 pages.

Ausserlechner; "The Piezo-Hall effect in n-silicon for arbitrary crystal orientation;" Proceedings of IEEE Sensors; vol. 3; Oct. 24, 2004; ISBN: 0-7803-8692-2; 4 pages.

(56) References Cited

OTHER PUBLICATIONS

Bahreyni, et al.; "A Resonant Micromachined Magnetic Field Sensor;" IEEE Sensors Journal; vol. 7, No. 9, Sep. 2007; 9 pages.
Baschirotto et al.; "Development and Analysis of PCB Vector 2-D Magnetic Field Sensor System for Electronic Compass;" IEEE Sensors Journal vol. 6, No. 2; Apr. 2006; 7 pages.
Bilotti et al.; "Monolithic Magnetic Hall Sensor Using Dynamic Quadrature Offset Cancellation;" IEEE Journal of Solid-State Circuits; vol. 32, Issue 6; Jun. 1997; 8 pages.
Blagojevic et al.; "FD SOI Hall Sensor Electronics Interfaces for Energy Measurement;" Microelectronics Journal 37; Sep. 2006; 8 pages.
Certificate of Invention dated Jun. 4, 2014 for Chinese Application No. 200980106535.4; 36 pages.
Cesaretti et al.; "Effect of Stress Due to Plastic Package Moisture Absorption in Hall Sensors;" IEEE Transactions on Magnets; vol. 45; No. 10; Oct. 2009; 4 pages.
Chinese Office Action with English translation dated Apr. 15, 2013 for Chinese Application No. 200980106535.4; 9 pages.
Chinese Office Action with English translation dated Aug. 29, 2012 for Chinese Application No. 200980106535.4; 8 pages.
Chinese Office Action with English translation dated Nov. 7, 2013 for Chinese Application No. 200980106535.4; 9 pages.
Communication under Rule 71(3) EPC dated Sep. 14, 2018 for European Application No. 16716398.9; 7 pages.
Communication pursuant to Rules 161(1) and 162 EPC dated Oct. 17, 2018 for European Application No. 17713506.8; 3 pages.
Demierre, et al.; "Reference Magnetic Actuator for Self-Calibration of a Very Small Hall Sensor Array;" Sensors and Actuators A97-98; Apr. 2002; 8 pages.
English Translation of Report of Re-Examination before Appeal dated Nov. 28, 2016 for JP Appl. No. 2015-013206; 3 pages.
European Extended Search Report dated May 11, 2018 for European Application No. 17180353.9; 23 pages.
European Partial Search Report dated Dec. 19, 2017 for European Application No. 17180353.9; 19 pages.
Frick, et al.; "CMOS Microsystem for AC Current Measurement with Galvanic Isolation;" IEEE Sensors Journal; vol. 3, No. 6; Dec. 2003; 9 pages.
Government of India, Patent Office Examination Report dated Mar. 6, 2017; 8 pages.
Halg; "Piezo-Hall Coefficients of n-Type Silicon;" Journal of Applied Physics; vol. 64, No. 1; Jul. 1, 1988; 7 pages.
Hosticka; "CMOS Sensor Systems;" Sensors and Actuators A66; Apr. 1998; 7 pages.
Huber et al.; "Package Stress Monitor to Compensate for the Piezo-Hall Effect in CMOS Hall Sensors;" 2012 IEEE Sensors; Oct. 2012; 4 pages.
Huber et al.; "Package Stress Monitor to Compensate for the Piezo-Hall Effect in CMOS Hall Sensors;" IEEE Sensors Journal, vol. 13, No. 8; Aug. 2013; 9 pages.
International Preliminary Report on Patentability dated Oct. 19, 2017 for PCT. Application No. PCT/US2016/025495; 16 pages.
International Preliminary Report on Patentability dated Sep. 10, 2010 for PCT. Application No. PCT/US2009/031776, 10 pages.
Japanese Notice of Allowance dated Jun. 2, 2017 for Japanese Application No. 2015-013206; 13 pages.
Japanese Office Action with English translation dated Apr. 4, 2013 for Japanese Application No. 2010-547666; 13 pages.
Japanese Office Action with English translation dated Jan. 4, 2016 for Japanese Application No. 2015-013206; 7 pages.
Japanese Office Action with English translation dated Jun. 10, 2016 for Japanese Application No. 2015-013206; 6 pages.
Japanese Office Action with English translation dated Sep. 29, 2014 for Japanese Application No. 2010-547666; 8 pages.
Kammerer et al.; "A Hall Effect Sensors Network Insensitive to Mechanical Stress;" Proceedings of IEEE Sensors; Oct. 2004; 4 pages.
Kayal et al.; "Automatic Calibration of Hall Sensor Microsystems;" Microelectronics Journal 37; Sep. 2006; 7 pages.
Korean Office Action dated Jan. 30, 2015 for Korean Application No. 10-2014-7033792; 3 pages.
Korean Office Action with English translation dated Sep. 30, 2014 for Korean Application No. 10-2010-7019498; 10 pages.
Letter from Shardul Amarchand Mangaldas dated Sep. 15, 2017 for Indian Pat. Appl. No. 2318/KOLNP/2010; 1 page.
Letter from Yuasa and Hara dated Dec. 14, 2016 regarding Appeal for JP Pat Appl. No. 2015-013206; 3 pages.
Letter to Yuasa and Hara dated Feb. 17, 2017 for JP Pat. Appli. No. 2015-013206; 3 pages.
Magnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; 11 pages.
Manic et al.; "Short and Long-Term Stability Problems of Hall Plates in Plastic Packages;" IEEE $38^{th}$ Annual International Reliability Physics Symposium; Apr. 2000; 6 pages.
Manic; "Drift in Silicon Integrated Sensors and Circuits Due to the Thermo-Mechanical Stresses;" Lausanne, Ecole Polytechnique Fédérale De Lausanne 2000; 176 pages.
Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; 7 pages.
Motz, et al.; "A Chopped Hall Sensor with Small Jitter and Programmable "True Power-On" Function;" IEEE Journal of Solid-State Circuits; vol. 40, No. 7; Jul. 2005; 8 pages.
Motz, et al.; "An Integrated Hall Sensor Platform Design for Position, Angle and Current Sensing;" IEEE Sensors 2006; Exco, Daegu, Korea; Oct. 22-25, 2006; 4 pages.
Munter; "A Low-offset Spinning-current Hall Plate;" Sensors and Actuators A21-A23; 1990; 4 pages.
Munter; "Electronic Circuitry for a Smart Spinning-current Hall Plate with Low Offset;" Sensors and Actuators A; Jun. 1991; 5 pages.
Notice of Allowance dated Feb. 17, 2017 from U.S. Appl. No. 14/681,575; 13 pages.
Notice of Allowance dated Jul. 16, 2018 for U.S. Appl. No. 15/066,331; 10 pages.
Notice of Allowance dated Jun. 27, 2011 for U.S. Appl. No. 12/959,672; 8 pages.
Notice of Allowance dated Nov. 3, 2010 for U.S. Appl. No. 12/037,393, 7 pages.
Notice of Allowance dated Aug. 31, 2018 for U.S. Appl. No. 15/207,903; 8 pages.
Office Action dated Apr. 27, 2018 for U.S. Appl. No. 15/066,331; 11 pages.
Office Action dated Aug. 12, 2016 for U.S. Appl. No. 14/681,575; 27 pages.
Office Action dated Feb. 2, 2011 for U.S. Appl. No. 12/959,672; 13 pages.
Office Action dated Jun. 30, 2010 for U.S. Appl. No. 12/37,393; 11 pages.
Office Action dated Apr. 3, 2018 for U.S. Appl. No. 15/207,903; 21 pages.
Official Communication reply dated May 9, 2018 for EP Pat. Appl. No. 16716398.9; 3 pages.
Partin et al.; "Temperature Stable Hall Effect Sensors;" IEEE Sensors Journal, vol. 6, No. 1; Feb. 2006; 5 pages.
Pastre, et al.; "A Hall Sensor-Based Current Measurement Microsystem With Continuous Gain Calibration;" Research in Microelectronics and Electronics, IEEE vol. 2; Jul. 25; 2005; ISBN: 0-7803-9345-7; 4 pages.
Popovic; "Sensor Microsystems;" Proc. $20^{th}$ International Conference on Microelectronics (MWIL 95); vol. 2, NIS, Serbia, Sep. 12-14, 1995; 7 pages.
Preliminary Amendment filed on Jan. 3, 2019 for U.S. Appl. No. 16/132,653; 10 pages.
Randhawa; "Monolithic Integrated Hall Devices in Silicon Circuits;" Microelectronics Journal; vol. 12, No. 6 Sep. 14-17, 1981; 6 pages.

(56) References Cited

OTHER PUBLICATIONS

Randjelovic et al.; "Highly Sensitive Hall Magnetic Sensor Microsystems in CMOS Technology;" IEEE Journal of Solid-State Circuits, vol. 37, No. 2; Feb. 2002; 9 pages.
Response to Chinese Office Action with English claims dated Dec. 19, 2013 for Chinese Application No. 200980106535.4; 18 pages.
Response to Chinese Office Action with English claims dated Jan. 24, 2012 for Chinese Application No. 200980106535.4; 20 pages.
Response to Chinese Office Action with English claims dated Jun. 27, 2013 for Chinese Application No. 200980106535.4; 21 pages.
Response to European Communication dated May 9, 2018 for European Application No. 16716398.9, 18 pages.
Response to Written Opinion for European Application No. 17180353.9 as filed on Dec. 13, 2018; 17 pages.
Response to Japanese Office Action with English claims dated Aug. 29, 2016 for Japanese Application No. 2015-013206; 10 pages.
Response to Japanese Office Action with English claims dated Mar. 17, 2016 for Japanese Application No. 2015-013206; 7 pages.
Response to Korean Office Action with English translation dated Dec. 1, 2014 for Korean Application No. 10-2010-7019498; 32 pages.
Response to Office Action dated Feb. 28, 2014 for Japanese Application No. 2010-547666; 11 pages.
Response to Office Action dated Jun. 8, 2018 for U.S. Appl. No. 15/066,331; 10 pages.
Response to Office Action dated May 24, 2011 for U.S. Appl. No. 12/959,672; 8 pages.
Response to Office Action dated Nov. 1, 2016 for U.S. Appl. No. 14/681,575; 12 pages.
Response to Office Action dated Oct. 14, 2010 for U.S. Appl. No. 12/37,393, 34 pages.
Response to Office Action dated Apr. 3, 2018 for U.S. Appl. No. 15/207,903, filed Apr. 12, 2018; 11 pages.
Response to Office Action with English claims dated Jan. 27, 2015 for Japanese Application No. 2010-547666; 10 pages.
Response to Office Action with English claims dated Jul. 3, 2013 for Japanese Application No. 2010-547666; 11 pages.
Response to Office Action with English translation dated Mar. 23, 2015 for Korean Application No. 10-2014-7033792; 11 pages.
Response to Restriction Requirement dated Jun. 2, 2010 for U.S. Appl. No. 12/37,393, 1 page.
Response to the First Examination Report filed on Sep. 6, 2017 for Indian Pat. Appl. No. 2318/KOLNP/2010; 37 pages.
Restriction Requirement dated May 14, 2010 for U.S. Appl. No. 12/37,393, 6 pages.
Restriction Requirement dated Mar. 2, 2018 for U.S. Appl. No. 15/207,903, 5 pages.
Ruther et al.; "Integrated CMOS-Based Sensor Array for Mechanical Stress Mapping;" 5$^{th}$ IEEE Conference on Sensors, Oct. 2007; 4 pages.
Ruther et al.; "Theromagnetic Residual Offset in Integrated Hall Plates;" IEEE Sensors Journal; vol. 3, No. 6; Dec. 2003; 7 pages.
Sargent; "Switched-capacitor IC controls feedback loop;" EDN; Design Ideas; Feb. 17, 2000; 2 pages.
Schneider, et al.; "Temperature Calibration of CMOS Magnetic Vector Probe for Contactless Angle Measurement System;" IEDM; Dec. 1996; 4 pages.
Schott et al.; "Linearizing Integrated Hall Devices;" 1997 International Conference on Solid-State Sensors and Actuators, Jun. 16-19, 1997; 4 pages.
Schott, et al.; "CMOS Single-Chip Electronic Compass with Microcontroller;" IEEE Journal of Solid-State Circuits; vol. 42, No. 12; Dec. 2007; 11 pages.
Schweda et al.; "A Nonlinear Simulation Model for Integrated Hall Devices in CMOS Silicon Technology;" Proceedings of 2002 IEEE International Behavioral Modeling and Simulation, BMAS 2002; Oct. 6-8, 2002; 7 pages.
Search Report and Written Opinion dated Jul. 20, 2016 for PCT Application No. PCT/US2016/025495; 20 pages.
Search Report and Written Opinion dated May 11, 2018 for European Application No. 17180353.9, 23 pages.
Search Report and Written Opinion dated May 22, 2017 for PCT Application No. PCT/US2017/020066; 14 pages.
Search Report and Written Opinion dated Oct. 23, 2009 for PCT. Application No. PCT/US2009/031776, 20 pages.
Simon et al.; "Autocalibration of Silicon Hall Devices;" 8$^{th}$ International Conference on Solid-State Sensors and Actuators; vol. 2; Jun. 25, 1995; 4 pages.
Steiner et al.; "Double-Hall Sensor with Self-Compensated Offset;" International Electron Devices Meeting; Dec. 7, 1997; ISBN: 0-7803-4100-7; 4 pages.
Steiner et al; Offset Reduction in Hall Devices by Continuous Spinning Current Method; Sensors and Actuators A66; 1998; 6 pages.
Stellrecht et al.; Characterization of Hygroscopic Swelling Behavior of Mold Compounds and Plastic Packages; IEEE Transactions on Components and Packaging Technologies; vol. 27, No. 3; Sep. 2004; 8 pages.
Tian et al.; "Multiple Sensors on Pulsed Eddy-Current Detection for 3-D Subsurface Crack Assessment;" IEEE Sensors Journal, vol. 5, No. 1; Feb. 2005; 7 pages.
Translation of Current Claims on file (as amended on Aug. 29, 2016) for JP 2015-013206; 2 pages.
Trontelj et al; "CMOS Integrated Magnetic Field Source Used as a Reference in Magnetic Field Sensors on Common Substrate;" WEP 1-6; IMTC; May 1994; 3 pages.
U.S. Non-Final Office Action dated Apr. 27, 2018 for U.S. Appl. No. 15/066,331; 11 pages.
Udo; "Limits of Offset Cancellation by the Principle of Spinning Current Hall Probe;" Proceedings of IEEE Sensors; Oct. 2004; 4 pages.
Van der Meer et al; "CMOS Quad-Spinning-Current Hall-Sensor System for Compass Application;" Proceedings of IEEE Sensors, vol. 3; Oct. 2004; 4 pages.
Written Statement in Response to Appeal dated Feb. 23, 2017 for Japanese Application No. 2015-013206; 9 pages.
Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; 3 pages.
Zou et al.; "Three-Dimensional Die Surface Stress Measurements in Delaminated and Non-Delaminated Plastic Packages;" 48th Electronic Components and Technology Conference; May 25, 1998; 12 pages.
Huber et al., "Package Stress Monitor to Compensate for the Piezo-Hall Effect in CMOS Hall Sensors"; 978-1-4577-1767-3/12, May 2012, © 2012 IEEE; 4 pages.
Huber et al., "A Fully Integrated Analog Compensation for the Piezo-Hall Effect in a CMOS Single-Chip Hall Sensor Microsystem;"; IEEE Sensors Journal, vol. 15, No. 5, May 2015; 10 pages.
PCT International Preliminary Report on Patentability dated Sep. 20, 2018, for Application No. PCT/US2017/020066; 8 Pages.
Office Action dated Sep. 10, 2019 for German Application No. 112009000448.2 with English Translation; 23 Pages.
Response to German Office Action with English machine translation dated Jan. 17, 2020 for German Application No. 112009000448.2; 26 pages.
A.A. Thornton Letter in response to Official Communication dated Mar. 22, 2019 for EP Pat. Appl. No. 17713506.8; 4 pages.
Tracked Amended Claims filed Mar. 22, 2019 in response to Official Communication for EP Pat. Appl. No. 17713506.8; 7 pages.
Amended specification description for p. 2 filed Mar. 22, 2019 in response to Official Communication for EP Pat. Appl. No. 17713506.8; 1 page.
Amended specification description for p. 2a filed Mar. 22, 2019 in response to Official Communication for EP Pat. Appl. No. 17713506.8; 1 page.
U.S. Notice of Allowance dated Feb. 11, 2019 for U.S. Appl. No. 16/132,653; 9 Pages.

(56) References Cited

OTHER PUBLICATIONS

Chinese Office Action with English translation dated May 18, 2020 for Chinese Application No. 201780016344.3; 37 pages.

* cited by examiner

SYSTEMS AND METHODS FOR REDUCING HIGH ORDER HALL PLATE SENSITIVITY TEMPERATURE COEFFICIENTS

CROSS REFERENCE TO RELATED APPLICATIONS

The present application is a divisional of U.S. patent application Ser. No. 15/207,903 filed Jul. 12, 2016 and entitled "SYSTEMS AND METHODS FOR REDUCING HIGH ORDER HALL PLATE SENSITIVITY TEMPERATURE COEFFICIENTS," which is incorporated herein by reference.

FIELD OF THE INVENTION

This invention relates generally to magnetic field sensors, and, more particularly, to a magnetic field sensor having an electronic circuit for compensating for a Hall plate sensitivity of a Hall effect element due to a stress of a substrate on which the Hall effect element and electronic circuit are disposed.

BACKGROUND

Hall effect elements are known. A typical planar or horizontal Hall effect element is a four terminal device for which a drive current (a DC current) is passed between two opposing ones of the four terminals and a differential voltage (AC or DC), responsive to a magnetic field (AC or DC), is generated between the other two opposing ones of the four terminals. An amplitude of the differential signal (i.e., voltage) is related an amplitude of the drive current. Thus, a sensitivity (e.g., mV per Gauss) of the differential signal is related to the amplitude of the drive current.

The Hall effect element can be used in current spinning or chopping arrangements in order to reduce a DC offset from the Hall effect element, which is typified by a non-zero output voltage from the Hall effect element even when experiencing a zero magnetic field. With current spinning or chopping, the terminals used to pass the drive current and the terminals used to generate the differential signal can be changed at a current spinning rate in a periodic and cyclic manner. There can be two such changes per cycle with two-phase current spinning or four such changes with four-phase current spinning.

In order to maintain a constant and stable sensitivity, the drive current can be generated with a stable current source or a current sink that uses a stable reference voltage. However, various parameters can cause the sensitivity to magnetic fields of the differential signal to change.

In general, even with a perfectly stable drive current, the Hall effect element itself can experience sensitivity changes. The changes in sensitivity of the Hall effect element can result directly from temperature changes. In order to correct for this sensitivity change, temperature can be sensed and the changes in sensitivity with temperature can be corrected.

However, the changes in sensitivity of the differential signal can also result from stresses upon a substrate on which the Hall effect element is disposed. The stresses may or may not be related to temperature and also may or may not be related to a thermal coefficient of a material of a package used to seal the substrate. The stresses and resulting changes in sensitivity may vary from unit to unit in different ways with respect to temperature.

SUMMARY

The systems and methods described herein reduce high order temperature coefficients on a Hall plate sensitivity. The high order temperature coefficients can be reduced to provide an output that a segment processor (e.g., digitally controlled segment processor), coupled to the circuitry, can properly process and compensate if necessary, thus improving the operation of the digitally controlled segment processor. For example, in some embodiments, a sensitivity temperature coefficient of a Hall effect element may be too large for the processor to properly compensate. Thus, the high order temperature coefficients (e.g., the strong negative temperature coefficient) can be reduced using specifically designed circuits that generate and provide reference voltages to an amplifier coupled to the Hall effect element.

In an embodiment, first order and/or a second order sensitivity temperature coefficients may be reduced using generated voltage references applied as currents on an amplifier. A temperate coefficient circuit may generate one or more reference voltages, such as a multiplication reference voltage and a division reference voltage, and convert them into currents, such as a multiplication reference current and a division reference current (e.g., $I_{mul}$ and $I_{div}$). The multiplication reference current and division reference current may be provided to an input of the amplifier to compensate for the high order temperature coefficients of a Hall effect element.

In an embodiment, the multiplication reference voltage may be a numerator term (e.g., voltage temperature coefficient numerator (VTCN)) and may be multiplied by a Hall plate sensitivity to reduce to first order temperature coefficient. The division reference voltage may be a denominator term (e.g., voltage temperature coefficient denominator (VTCD)) and be divided by the Hall plate sensitivity to reduce to a second order temperature coefficient. Thus, by selecting appropriate numerator and/or denominator terms, the first and/or second order sensitivity temperature coefficient can be reduced. In an embodiment, the appropriate numerator and/or denominator terms may be selected to reduce a sensitivity variation with temperature of the Hall plate sensitivity.

In a first aspect, a circuit is provided comprising a semiconductor substrate, an epitaxial layer disposed over a surface of the semiconductor substrate, a Hall effect element, at least a portion of the Hall effect element disposed in the epitaxial layer disposed over the surface of the semiconductor substrate and a current generator configured to generate a drive current that passes through the Hall effect element.

The current generator comprises a first resistor for receiving a reference voltage resulting in a reference current passing through the first resistor, the reference current related to the drive current, the first resistor disposed in the epitaxial layer. In an embodiment, a resistance of the first resistor, the reference current, and the drive current may change in accordance with changes of a stress in the semiconductor substrate. The current generator further comprises an amplifier coupled to the Hall effect element, the amplifier to receive a sensitivity signal from Hall effect element, the sensitivity signal having a first temperature coefficient, the amplifier to generate a compensated sensitivity signal, the compensated sensitivity signal having a second temperature coefficient; and A temperature compensation circuit may be coupled to the amplifier. The temperature compensation circuit may generate a multiplication reference current and provide the multiplication reference current to the amplifier. In an embodiment, the amplifier can apply the multiplication reference current to the amplifier to generate the compensated sensitivity signal with the second temperature coefficient smaller than the first temperature coefficient of the sensitivity signal.

In some embodiments, the first resistor may comprise a vertical epitaxial resistor. The first temperature coefficient may include a $1^{st}$ order temperature coefficient, a $2^{nd}$ order temperature coefficient, or both.

In some embodiments, the amplifier may include a front end amplifier comprised of a Gilbert cell. The Gilbert cell may be coupled to receive the multiplication reference current to apply a multiplication factor to the amplifier. The Hall effect element may include a horizontal Hall effect element.

In some embodiments, the first resistor can be coupled to a second amplifier to form a current source or a current sink. A current mirror may be coupled to the second amplifier. The current mirror may include a reference leg though which the reference current passes, and a drive leg through which the drive current passes. In an embodiment, the drive current passes through the Hall effect element passes between a higher voltage terminal of the Hall effect element and a lower voltage terminal of the Hall effect element. The drive leg of the current mirror may be coupled to the higher voltage terminal. The drive leg of the current mirror can be coupled to the lower voltage terminal.

In some embodiments, the first resistor may include first and second pickups implanted upon and diffused into a first surface of the epitaxial layer and a first buried structure disposed under the first surface of the epitaxial layer and under the first and second pickups. The first buried structure may have a density of atoms that results in a first low resistance path with a first resistance lower than a resistance of the epitaxial layer. The reference current can pass from the first pickup, through a first region of the epitaxial layer, through the first buried structure, and through a second region of the epitaxial layer to the second pickup.

In some embodiments, the current generator includes a second resistor having an orthogonal orientation with respect to the first resistor. The second resistor can be coupled in series or in parallel with the first resistor, the second resistor disposed in the epitaxial layer. The second resistor may include third and fourth pickups implanted upon and diffused into the first surface of the epitaxial layer and a second buried structure disposed under the first surface of the epitaxial layer and under the third and fourth pickups. The second buried structure can have a density of atoms that results in a second low resistance path with a second resistance lower than the resistance of the epitaxial layer, wherein at least a portion of the reference current passes from the third pickup, through a third region of the epitaxial layer, through the second buried structure, and through a fourth region of the epitaxial layer to the fourth pickup.

In another aspect, a circuit is provide comprising a semiconductor substrate, an epitaxial layer disposed over a surface of the semiconductor substrate, a Hall effect element, at least a portion of the Hall effect element disposed in the epitaxial layer disposed over the surface of the semiconductor substrate and a current generator configured to generate a drive current that passes through the Hall effect element.

In some embodiments, the current generator comprises a first resistor for receiving a reference voltage resulting in a reference current passing through the first resistor. The reference current can be related to the drive current, the first resistor disposed in the epitaxial layer, wherein a resistance of the first resistor, the reference current, and the drive current change in accordance with changes of a stress in the semiconductor substrate.

In some embodiments, the current generator further comprises an amplifier coupled to the Hall effect element. The amplifier can receive a sensitivity signal from Hall effect element, the sensitivity signal having a first temperature coefficient, the amplifier to generate a compensated sensitivity signal, the compensated sensitivity signal having a second temperature coefficient. The current generator may further comprise a temperature compensation circuit coupled to the amplifier. The temperature compensation circuit can generate a multiplication reference current and a division reference current and provide the multiplication reference current and the division reference current to the amplifier to the amplifier. In an embodiment, the amplifier applies the multiplication reference current and the division reference current to the amplifier to generate the compensated sensitivity signal with the second temperature coefficient smaller than the first temperature coefficient of the sensitivity signal.

In some embodiments, the first resistor can include a vertical epitaxial resistor. The first portion of the temperature coefficient may include a $1^{st}$ order temperature coefficient of the Hall effect element and the second portion of the temperature coefficient can be a $2^{nd}$ order temperature coefficient of the Hall effect element.

In some embodiments, the amplifier may include a front end amplifier comprised of a Gilbert cell. The Gilbert cell can be coupled to receive the multiplication reference current to apply a multiplication factor to the amplifier. The Hall effect element may include a horizontal Hall effect element.

In some embodiments, the first resistor can be coupled to a second amplifier to form a current source or a current sink. A current mirror can be coupled to the second amplifier. The current mirror may include a reference leg though which the reference current passes, and a drive leg through which the drive current passes. The drive current passing through the Hall effect element passes between a higher voltage terminal of the Hall effect element and a lower voltage terminal of the Hall effect element. The drive leg of the current mirror can be coupled to the higher voltage terminal. In some embodiments, the drive leg of the current mirror can be coupled to the lower voltage terminal.

In some embodiments, the first resistor may include first and second pickups implanted upon and diffused into a first surface of the epitaxial layer and a first buried structure disposed under the first surface of the epitaxial layer and under the first and second pickups. The first buried structure can have a density of atoms that results in a first low resistance path with a first resistance lower than a resistance of the epitaxial layer. The reference current passes from the first pickup, through a first region of the epitaxial layer, through the first buried structure, and through a second region of the epitaxial layer to the second pickup.

In some embodiments, the current generator may include a second resistor having an orthogonal orientation with respect to the first resistor. The second resistor can be coupled in series or in parallel with the first resistor, the second resistor disposed in the epitaxial layer. The second resistor may include third and fourth pickups implanted upon and diffused into the first surface of the epitaxial layer and a second buried structure disposed under the first surface of the epitaxial layer and under the third and fourth pickups. The second buried structure can have a density of atoms that results in a second low resistance path with a second resistance lower than the resistance of the epitaxial layer. In an embodiment, at least a portion of the reference current passes from the third pickup, through a third region of the epitaxial layer, through the second buried structure, and through a fourth region of the epitaxial layer to the fourth pickup. In some embodiments, a first length dimension of the first buried structure can be disposed parallel to a first edge of the Hall effect element and proximate to the Hall effect element and a second length dimension of the second buried structure can be disposed parallel to a second edge of the Hall effect element and proximate to the Hall effect element. The second length dimension of the second buried structure can be arranged perpendicular to the first length dimension of the first buried structure.

In another aspect, a circuit is provided comprising a first amplifier to receive a first reference voltage generated in conjunction with a proportional to absolute temperature (PTAT) device, the first amplifier having a first output node. The circuit may further include a second amplifier to receive a second reference voltage generated in conjunction with a complementary to absolute temperature (CTAT) device. In an embodiment, the second reference voltage (CTAT) may have an opposite temperature coefficient with respect to the first reference voltage (PTAT). The second amplifier can have a second output node, a plurality of resistors disposed in a signal path between the first output node and the second output node, the plurality of resistors having at least one resistor tap, at least one voltage-to-current converter coupled to the at least one resistor tap, the at least one voltage-to-current converter to generate a respective at least one current signal and a third amplifier, the third amplifier having a Gilbert cell coupled to the at least one current signal, the at least one current signal operable to apply a multiplication factor or a division divisor to the Gilbert cell.

In some embodiments, the at least one resistor tap includes a plurality of resistor taps. The at least one voltage-to-current converter may include a plurality of voltage-to-current converters.

In some embodiments, the circuit further includes a multiplexer coupled between the plurality of resistors and the plurality of voltage-to-current converters. The multiplexer can have a plurality of input nodes coupled to the plurality of resistor taps, the plurality of multiplexers having a plurality of output nodes. The multiplexer can receive one or more voltages from the plurality of resistor taps and generate a multiplication reference voltage related to the multiplication factor and a division reference voltage related to the division divisor.

In some embodiments, the first reference voltage can be coupled to a noninverting terminal of the first amplifier. The second reference voltage can be coupled to a noninverting terminal of the second amplifier.

In some embodiments, the multiplexer may include a first multiplexer having one or more input nodes coupled to the plurality of resistors and a second multiplexer having one or more inputs coupled to the plurality of resistors. In an embodiment, the first multiplexer may receive one or more voltages from the plurality of resistors and generates the multiplication reference voltage and the second multiplexer may receive one or more voltages from the plurality of resistors and generates the division reference voltage.

In some embodiments, a first converter may be coupled to the multiplexer. The first converter may receive the multiplication reference voltage and generate a multiplication reference current. The first reference voltage can have a predetermined non-zero sensitivity to temperature. The second reference voltage can be insensitive to a change in temperature. In an embodiment, the first and second amplifiers may include respective noninverting operational amplifiers.

BRIEF DESCRIPTION OF THE DRAWINGS

The foregoing concepts and features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the concepts, systems and techniques described herein. Like numbers in the figures denote like elements.

DETAILED DESCRIPTION

Figure 1:
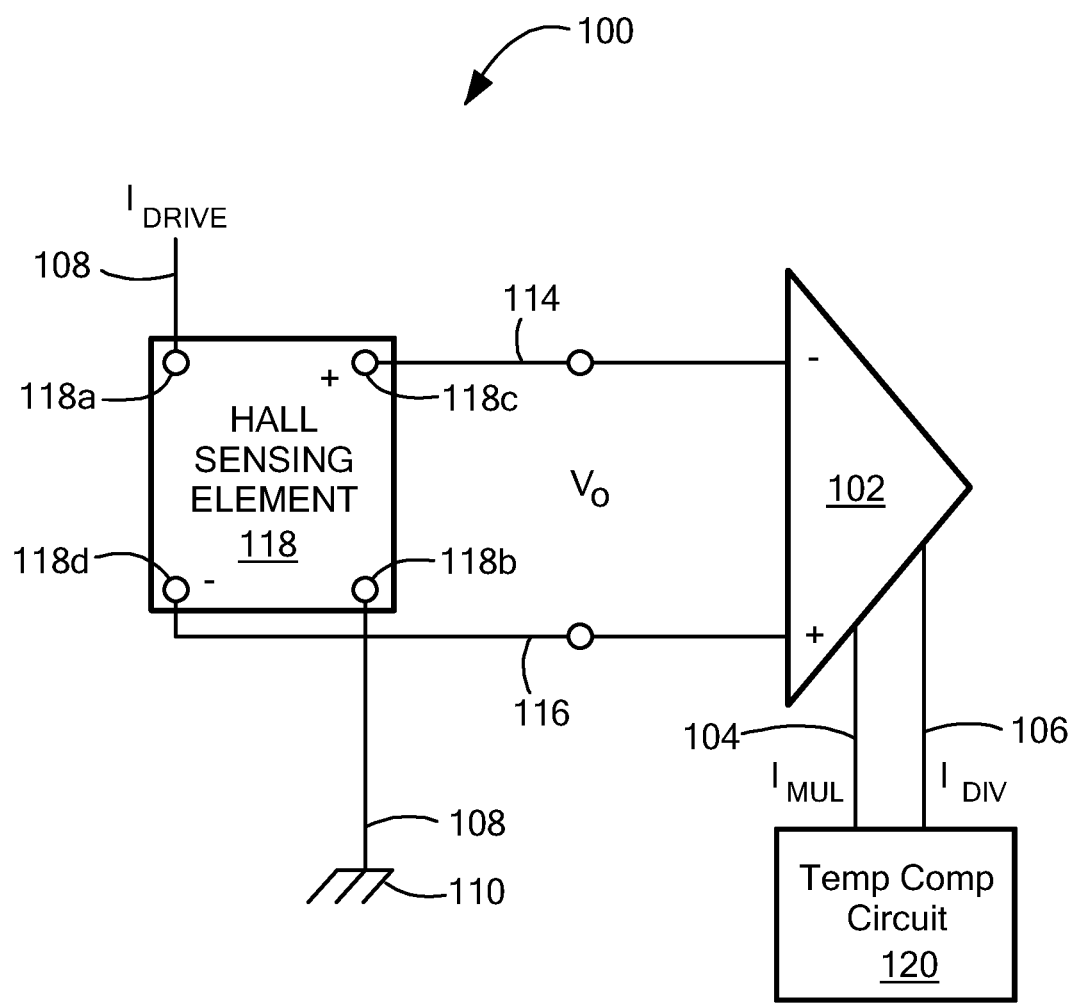
FIG. 1 is a block diagram of an electronic circuit, having a Hall effect element, and a temperature compensation circuit coupled to an amplifier.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor.

As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe an electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

The terms "parallel" and" perpendicular" may be used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/− ten degrees.

As used herein, the term "current generator" is used to describe either a current source or a current sink. It should be understood that a current source has a current output and a current sink has a current input, with a high output or input impedance, respectively.

As used herein, the term "current passing terminal" is used to describe a terminal of an active or passive electronic component that either receives a current or out of which a current comes. Thus, it will be appreciated that both a collector and emitter of a bipolar junction transistor (BJT) are current passing terminals. It will also be appreciated that both a source and a drain of the field effect transistor (FET) are current passing terminals.

As used herein, the term "substrate" is used to describe any type of structure with a flat surface upon which semiconductor materials can be deposited and/or into which semiconductor materials can be implanted and diffused. In some embodiments, the substrate is a P-type silicon substrate having a particular range of concentrations of P-type atoms (i.e., ions)

As used herein, the term "epi" is used to refer to an epitaxial layer, for example, an N-type epitaxial layer, disposed over a substrate, for example, a P-type substrate, and having a particular range of concentrations of N-type atoms (i.e. ions).

As used herein, the term "N+" or "NP" is used to refer to a region implanted and diffused into a semiconductor layer, for example, into a surface of the epitaxial layer furthest from the substrate, and having another particular range of concentrations of N-type atoms (i.e. ions).

As used herein, the term "Light-N" or simply "LN" is used to refer to a region implanted and diffused into a semiconductor layer, for example, into a surface of the epitaxial layer further from the substrate, and having a particular range of concentrations of N-type atoms (i.e. ions).

As used herein, the term "P-well" is used to refer to a region implanted and diffused into a semiconductor layer, for example, into a surface of the epitaxial layer further from the substrate, and having a particular range of concentrations of P-type atoms (i.e. ions).

As used herein, the term "P-type buried layer" or simply "PBL" is used to refer to a region implanted and diffused into a semiconductor layer, for example, implanted into the substrate and then upwardly diffused into the epitaxial (epi) layer (also referred to herein as an epi layer). The epi layer can be grown after PBL implant and diffusion steps, and the upward diffusion into epi layer can be performed during a field oxidation process.

As used herein, the term "N-type buried layer" or simply "NBL" is used to refer to a region implanted and diffused into a semiconductor layer, for example, implanted into the substrate and then upwardly diffused into the epitaxial (epi) layer. The epi layer can be grown after NBL implant and diffusion steps, and the upward diffusion into epi layer can be performed during a field oxidation process.

As used herein, the term "P+" or "PP" is used to refer to a region implanted and diffused into a semiconductor layer, for example, into a surface of the epitaxial layer furthest from the substrate, and having another particular range of concentrations of P-type atoms (i.e. ions).

As used herein, the concentrations of the above types of semiconductor structures can fall into the following ranges:
  substrate=about $1 \times 10^{15}$ P-type atoms per cm3, for example, boron atoms.
  epi=about $1 \times 10^{15}$ to about $6 \times 10^{15}$ N-type atoms per cm3, for example, Arsenic atoms,
  where: $5 \times 10^{14}$ to $1 \times 10^{15}$ can be representative of a concentration of epi bulk doping, and $5 \times 10^{15}$ to $1 \times 10^{16}$ can be representative of a concentration at a surface region of the epi layer at about 2 um depth created by an additional epi implant step. (Alternatively, $1 \times 10^{15}$ to $6 \times 10^{15}$).
  N+=about $1 \times 10^{20}$ N-type atoms per cm3, for example, phosphorous atoms.
  LN=about 1 to $2 \times 10^{17}$ atoms per cm3, for example, phosphorous atoms.
  P-well=about $1 \times 10^{16}$ P-type atoms per cm3, for example, boron atoms.
  PBL=about $1 \times 10^{18}$ to about $2 \times 10^{18}$ P-type atoms per cm3, for example, boron atoms.
  NBL=about $1 \times 10^{19}$ to about $1.5 \times 10^{19}$ N-type atoms per cm3, for example, antimony atoms.
  P+=about $3 \times 10^{19}$ to about $5 \times 10^{19}$ P-type atoms per cm3, for example, boron atoms.

In some embodiments, the concentrations are outside of the above ranges or values, but can be within about +/− twenty percent of the above ranges or values.

It should be noted that reference is sometimes made herein to assemblies having a particular shape (e.g., rectangular or square). One of ordinary skill in the art will appreciate, however, that the techniques described herein are applicable to a variety of sizes and shapes.

Referring now to FIG. 1, an electronic circuit 100 includes a Hall effect element 118 and a temperature compensation circuit 120, both coupled to an amplifier 102.

Hall effect element 118 may have four terminals, 118a-118d. In an embodiment, a drive current 108 can be received by a first terminal 118a of the Hall effect element 118. The drive current 108 can pass from the first terminal 118a, through the Hall effect element 118, to a second terminal 118b. A voltage reference, for example, ground 110, can be coupled to receive the drive current 108.

A third terminal 118c can be coupled to a first input of amplifier 102 and a fourth terminal 118d can be coupled to a second input of amplifier 102. For example, a differential output signal 114, 116 (e.g., a differential voltage) can be generated between the third terminal 118c and fourth terminal 118d, respectively, of Hall effect element 118. The differential output signal 114, 116 can be related to the drive current 108, an also related to a magnitude of an external magnetic field. The differential output signal 114, 116 can be provided to the amplifier 102 by the third terminal 118c and fourth terminal 118d, respectively, of Hall effect element 118.

Temperature compensation circuit 120 may have one or more outputs corresponding to a reference current or voltage. For example, and as illustrated in FIG. 1, temperature compensation circuit 120 has a first output 104 and second output 106. The first output 104 may be a multiplication reference current and the second output 106 may be a division reference current. The first output 104 may be coupled to and provide the multiplication reference current to the amplifier 120. The second output 106 may be coupled to and provide the division reference current to amplifier 102. Temperature compensation circuit 120 will be described in greater detail with respect to FIG. 6 below.

In an embodiment, amplifier 102 can apply the multiplication reference current and/or the division reference current to the differential output signal 114, 116 (e.g., sensitivity signal) to generate a compensated sensitivity signal having a different temperature coefficient than the differential output signal 114, 116 (e.g., sensitivity signal) received from Hall effect element 118.

In an embodiment, a sensitivity of the Hall effect element 118 (i.e., sensitivity of the differential output signal 114, 116) can be directly related to a value of the drive current 108. For example, the sensitivity of the Hall effect element 118 (i.e., sensitivity of the differential output signal 114, 116) can vary or change directly with temperature. The sensitivity of the Hall effect element 118 can also vary or change in a way related to stresses upon a substrate in which the Hall effect element 118 is disposed, which stresses may or may not be related to temperature.

Figure 2:
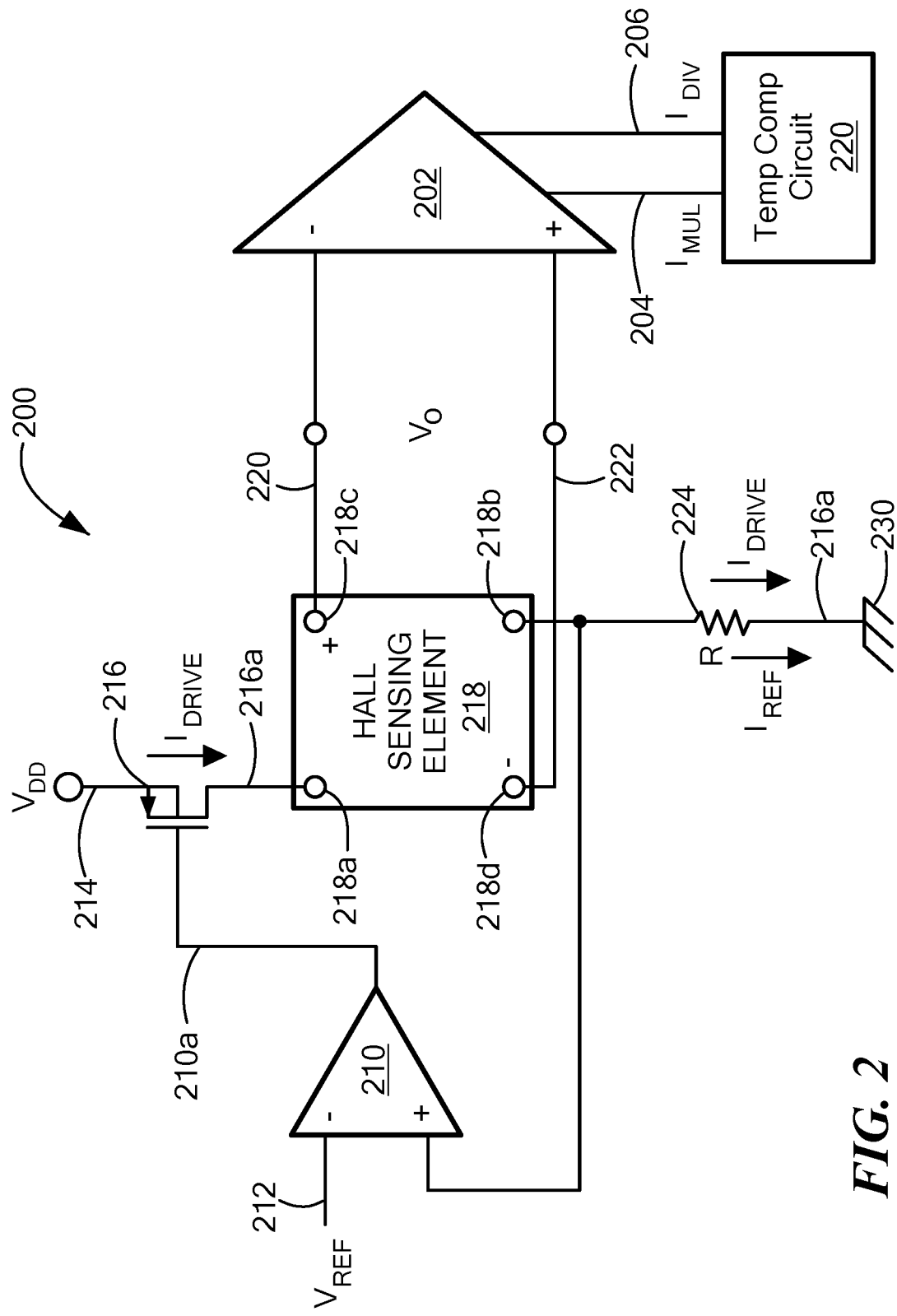
FIG. 2 is a block diagram of an electronic circuit, having a Hall effect element, and driven with a current generator, the electronic circuit and a temperature compensation circuit coupled to an amplifier.

Referring now to FIG. 2, an electronic circuit 200 includes an amplifier 210, a Hall effect element 218, a temperature compensation circuit 220 and an amplifier 202.

Amplifier 210 may be an operational amplifier and can be coupled to receive a reference voltage 212 at an inverting terminal. The amplifier 210 can generate a control signal 210a and be coupled to a transistor 216 (e.g., field effect transistor) to provide the control signal 210a. For example, a gate terminal of the transistor 216 may receive the control signal 210a. A source of the transistor 216 can be coupled to receive a voltage 214. A drive current 216a can be output from a drain terminal of the transistor 216.

Hall effect element 218 may have four terminals, 218a-218d. In an embodiment, drive current 216a can be received by a first terminal 218a of the Hall effect element 218. The drive current 216a can pass from the first terminal 218a, through the Hall effect element 218, to a second terminal 218b. A voltage reference, for example, ground 230, can be coupled to receive the drive current 216a. In some embodiments, a resistor 224 is provided. The resistor 224 may compensate for variations in the sensitivity of the Hall effect element 218 that occur due to stress of the substrate on which the electronic circuit 200 is disposed.

In an embodiment, a sensitivity of the Hall effect element 218 (i.e., sensitivity of the differential output signal 220, 222) can be directly related to a value of the drive current 216a. For example, the sensitivity of the Hall effect element 218 (i.e., sensitivity of the differential output signal 220, 222) can vary or change directly with temperature. The sensitivity of the Hall effect element 218 can also vary or change in a way related to stresses upon a substrate in which the Hall effect element 218 is disposed, which stresses may or may not be related to temperature.

A third terminal 218c can be coupled to a first input of amplifier 202 and a fourth terminal 218d can be coupled to a second input of amplifier 202. For example, a differential output signal 220, 222 (e.g., a differential voltage) can be generated between the third terminal 218c and fourth terminal 218d, respectively, of Hall effect element 218. The differential output signal 220, 222 can be related to the drive current 216a, an also related to a magnitude of an external magnetic field. The differential output signal 220, 222 can be provided to the amplifier 202 by the third terminal 218c and fourth terminal 218d, respectively, of Hall effect element 218.

Temperature compensation circuit 220 may have one or more outputs corresponding to a reference current or voltage. For example, and as illustrated in FIG. 2, temperature compensation circuit 220 has a first output 204 and second output 206. The first output 204 may be a multiplication reference current and the second output 206 may be a division reference current. The first output 204 may be coupled to and provide the multiplication reference current to the amplifier 202. The second output 106 may be coupled to and provide the division reference current to amplifier 120. Temperature compensation circuit 220 will be described in greater detail with respect to FIG. 6 below.

In an embodiment, amplifier 202 can apply the multiplication reference current and/or the division reference current to the differential output signal 220, 222 (e.g., sensitivity signal) to generate a compensated sensitivity signal having a different temperature coefficient than the differential output signal 220, 222 (e.g., sensitivity signal) received from Hall effect element 218.

In an embodiment, similar to Hall effect element 118, a sensitivity of the Hall effect element 218 (i.e., sensitivity of the differential output signal 220, 222) can be directly related to a value of the drive current 216a. For example, the sensitivity of the Hall effect element 218 (i.e., sensitivity of the differential output signal 220, 222) can vary or change directly with temperature. The sensitivity of the Hall effect element 218 can also vary or change in a way related to stresses upon a substrate in which the Hall effect element 218 is disposed, which stresses may or may not be related to temperature. Thus, the input to amplifier 202 can have a large first and/or second order temperature coefficient, large enough to impact the operation of amplifier 202.

In an embodiment, resistor 224 may have a particular construction that and be appropriately sized such that a resistance of the resistor 224 changes with stress of the substrate by an amount that generally compensates for changes in the sensitivity of the Hall effect element 218 with regard to stress, essentially by changing the drive current 216a as the stress changes. Thus, the input to amplifier 202 can be compensated to address the changes in the sensitivity of the Hall effect element 218. However, in some embodiments, further compensation may be needed to reduce a first and/or second order temperature coefficient of Hall effect element 218, as will be discussed in greater detail below with respect to FIGS. 3-7.

Figure 2A:
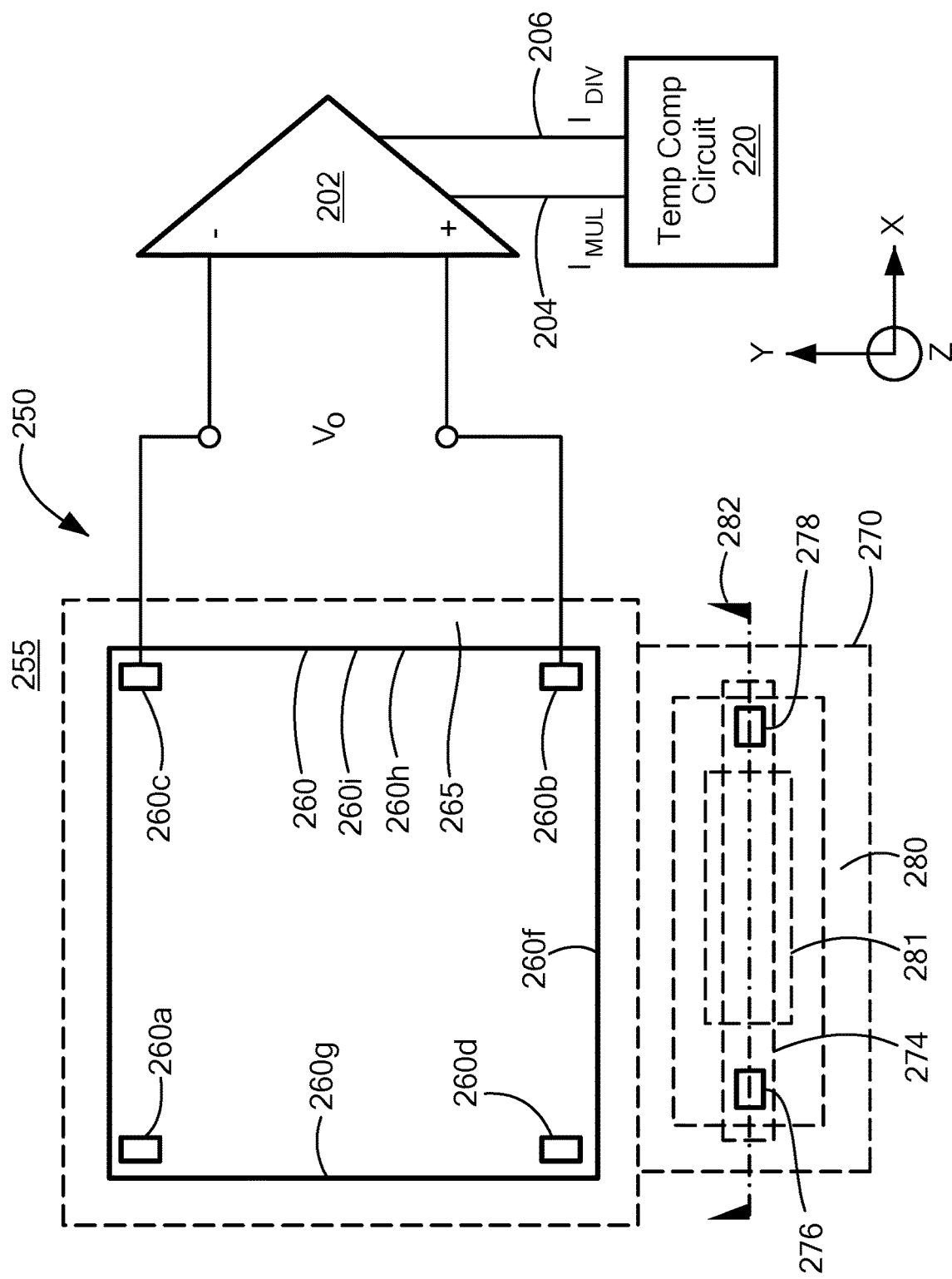
FIG. 2A is a block diagram showing a top view of a substrate having a Hall effect element and a resistor formed thereon.

Referring now to FIG. 2A, an electronic circuit 250 is formed upon an epitaxial layer 255 over a substrate under the epitaxial layer 255. In an embodiment, an electronic circuit 250 may be the same as or substantially similar to electronic circuit 100 of FIG. 1, electronic circuit 200 of FIG. 2 and electronic circuit 300 of FIG. 3. In an embodiment, circuits described herein may be formed on or otherwise disposed on an epitaxial layer substantially similar to and with methods as those described in U.S. patent application Ser. No. 14/681,575, entitled "Electronic Circuit For Driving A Hall Effect Element With A Current Compensated For Substrate Stress," filed on Apr. 8, 2015, assigned to the assignee of the subject application and incorporated herein by reference. For example, and as illustrated in FIG. 2A, Hall effect element 260 may be coupled to amplifier 202 and amplifier 202 may be coupled to temperature compensation circuit 220.

The electronic circuit 250 can include a Hall effect element 260, shown in part as a bounded portion 264i of the epitaxial layer 255, bounded by an electrical barrier 265 to electron flow, the barrier defining a perimeter boundary of the Hall effect element 260. The electrical barrier 265 can be comprised of a PBL region under a P-well region.

The bounded portion 260i can form a Hall plate of the Hall effect element 260. Over the bounded portion 260 can be a field plate, which, in some embodiments, can be formed in a metal layer. The field plate can have approximately the same dimensions in the x-y plane as the bounded portion 260i, thus reference designator 260i can be used to refer to either the Hall plate, i.e., bounded portion, in the epitaxial layer 255 or the field plate above the epitaxial payer 255.

The Hall effect 260 element can include four pickups 260a, 260b, 260c, 260d, which can be used and coupled in the same way, or in a similar way, as the four terminals 118a, 118b, 118c, 118d described above in conjunction with FIG. 1 of Hall effect element 118, four terminals 218a, 218b, 218c, 218d described above in conjunction with FIG. 2 of Hall effect element 218 and four terminals 318a, 318b, 318c, 318d described below in conjunction with FIG. 3 of Hall effect element 318. In an embodiment, the four pickups 260a, 260b, 260c, 260d can be a corresponding four contacts (not shown) formed in a metal layer.

The bounded portion 260i of the Hall effect element 260 can, in some embodiments, form a square shape having four sides or edges 260e, 260f, 260g, 260h. However, in other embodiments, the bounded portion 260i (and the Hall plate and field plate) need not have a square shape. For example, a Hall element with a wide cross shape is described in U.S. Pat. No. 8,357,983, issued Jan. 22, 2013, which is assigned to the assignee of the present invention and which is incorporated by reference herein in its entirety.

It should be understood that the Hall effect element 260 can be a horizontal or planar Hall effect element, which can have an axis of maximum sensitivity parallel to a z-axis.

Figure 3:
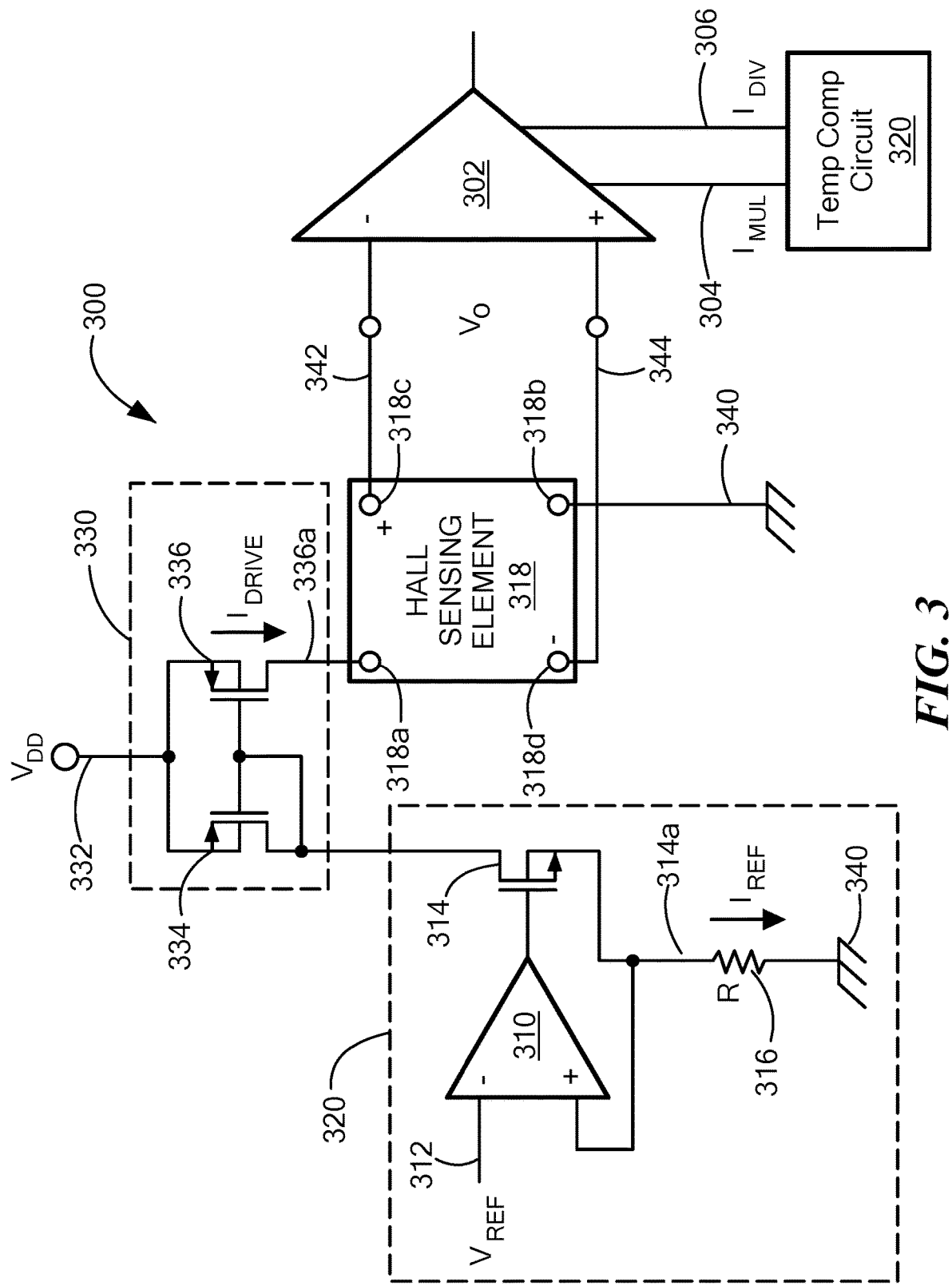
FIG. 3 is a block diagram of an electronic circuit, having a Hall effect element, and driven with a current generator, the electronic circuit and a temperature compensation circuit coupled to an amplifier.
Figure 4:
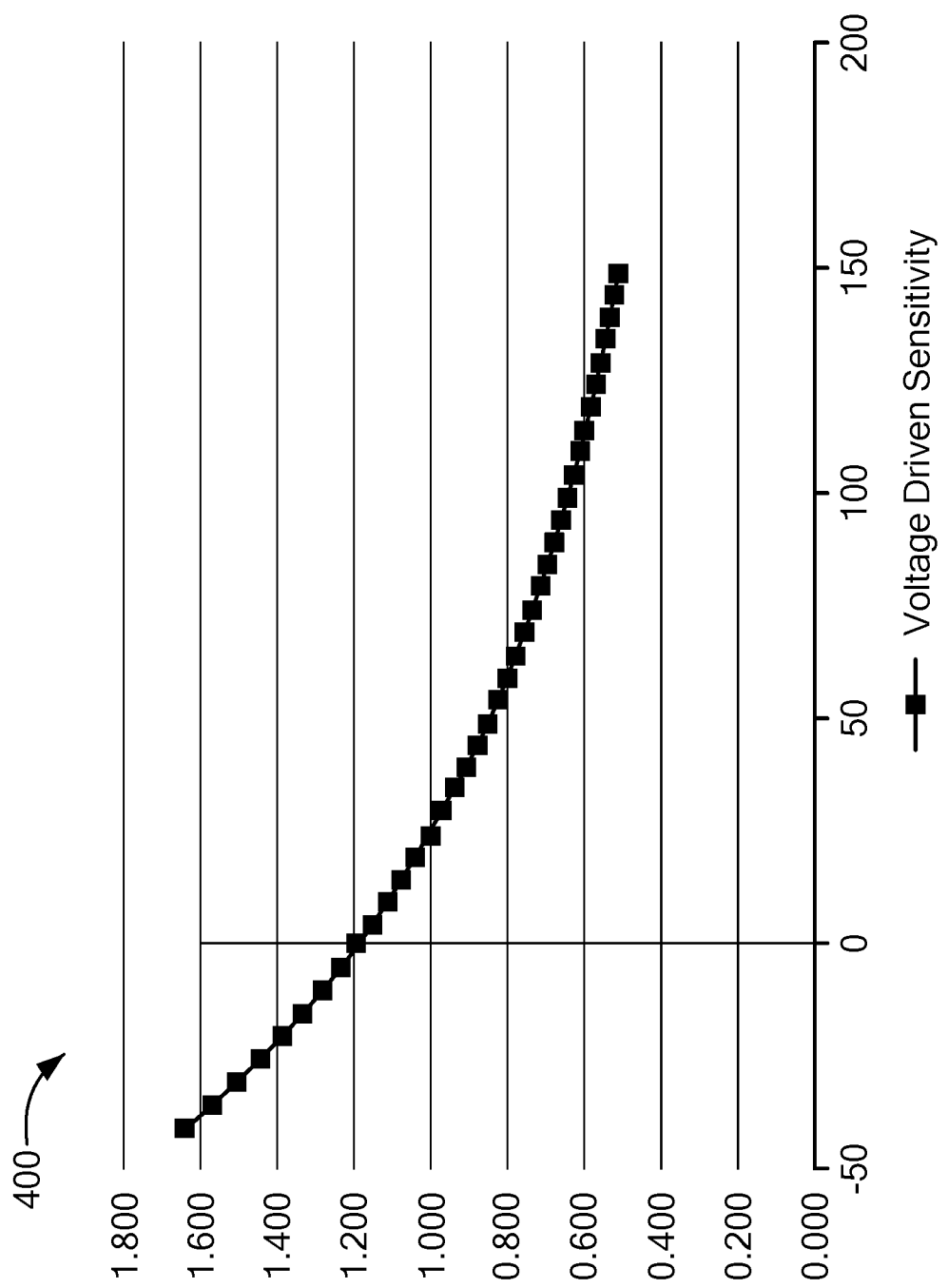
FIG. 4 is a plot of the sensitivity of a Hall effect element.

The electronic circuit 250 can also include a resistor 270, which can be the same as or similar to the resistor 224 of FIG. 2 and the resistor 316 of FIG. 3.

The resistor 270 can include an NBL region 274, a P-well region 281, a barrier region 280, and two pickups 276, 278. The NBL region 274 can have a length with a length dimension parallel to the x-axis and a width with a width dimension parallel to the y-axis. The length dimension of the NBL region 274 can be parallel to the edge 260f of the Hall effect element 260. However, in other embodiments, the length dimension is not parallel to an edge of the Hall effect element 260. While the width dimension of the NBL region 264 is shown to be less than the length dimension, in other embodiments, the width dimension can be equal to or greater than the length dimension.

Referring now to FIG. 3, an electronic circuit 300 includes a current generator 320, a current mirror 330, a Hall effect element 318, a temperature compensation circuit 320 and an amplifier 302.

Current generator 320 can include an amplifier 310 (e.g., operational amplifier). Amplifier 310 can be coupled to receive a reference voltage 312 at a noninverting terminal. Amplifier 310 can generate a control signal 310a and be coupled to a transistor 314 (e.g., N-channel FET).

A source of transistor 314 can be coupled to an inverting terminal of the amplifier 310 and also coupled to a first end of a resistor 316. The other end of the resistor 316 can be coupled to a voltage reference, for example, a ground 340.

In an embodiment, current generator 320 is operable to generate a reference current 314a that passes through the resistor 316, and also through transistor 314. For example, reference current 314a may be provided to into the drain of transistor 314. The reference current 314a can be generated in accordance with a reference voltage generated across the resistor 316 due to a feedback arrangement around the amplifier 310. In an embodiment, the current generator 320 may use the operation amplifier 104 to achieve the reference voltage across the resistor 316 by way of feedback, however, it should be appreciated that there are other ways to achieve the reference voltage across the resistor 316 without using an amplifier.

A drain of transistor 314 can be coupled to the current mirror 330. Current mirror 330 may include a first transistor 334 and a second transistor 336. A drain of the first transistor 334 (e.g., P-Channel FET) can be coupled to the drain of transistor 314 of current generator 320. A gate of current mirror 330 can be coupled to the drain of first transistor 334 forming a diode structure.

The gate of the first transistor 334 can be coupled to a gate of the second transistor 336. A source of the first transistor 334 can be coupled to a source of the second transistor 336, which can both be coupled to receive the voltage 332. A drain of the second transistor 336 can supply a drive current 336a.

In some embodiments, the drive current 336a has the same current value as the reference current 314a. However, it will be understood that, by scaling relative physical sizes of the first and second transistors 334, 336, the drive current 336a can be greater than or less than the reference current 314a.

Hall effect element 318 may have four terminals, 318a-318d. In an embodiment, drive current 336a can be received by a first terminal 318a of the Hall effect element 318. The drive current 336a can pass from the first terminal 318a, through the Hall effect element 318, to a second terminal 318b. A voltage reference, for example, ground 340, can be coupled to receive the drive current 336a.

A third terminal 318c can be coupled to a first input of amplifier 302 and a fourth terminal 318d can be coupled to a second input of amplifier 302. For example, a differential output signal 342, 344 (e.g., a differential voltage) can be generated between the third terminal 318c and fourth terminal 318d, respectively, of Hall effect element 318. The differential output signal 342, 344 can be related to the drive current 336a, an also related to a magnitude of an external magnetic field. The differential output signal 342, 344 can be provided to the amplifier 302 by the third terminal 318c and fourth terminal 318d, respectively, of Hall effect element 318.

In an embodiment, a sensitivity of the Hall effect element 318 (i.e., sensitivity of the differential output signal 342, 344) can be directly related to a value of the drive current 336a. For example, the sensitivity of the Hall effect element 318 (i.e., sensitivity of the differential output signal 342, 344) can vary or change directly with temperature. The sensitivity of the Hall effect element 318 can also vary or change in a way related to stresses upon a substrate in which the Hall effect element 318 is disposed, which stresses may or may not be related to temperature.

Temperature compensation circuit 320 may have one or more outputs corresponding to a reference current or voltage. For example, and as illustrated in FIG. 3, temperature compensation circuit 320 has a first output 304 and second output 306. The first output 304 may be a multiplication reference current and the second output 306 may be a division reference current. The first output 304 may be coupled to and provide the multiplication reference current to the amplifier 302. The second output 306 may be coupled to and provide the division reference current to amplifier 320. Temperature compensation circuit 320 will be described in greater detail with respect to FIG. 6 below.

In an embodiment, amplifier 302 can apply the multiplication reference current and/or the division reference current to the differential output signal 342, 344 (e.g., sensitivity signal) to generate a compensated sensitivity signal having a different temperature coefficient than the differential output signal 342, 344 (e.g., sensitivity signal) received from Hall effect element 318.

In an embodiment, a sensitivity of the Hall effect element 318 (i.e., sensitivity of the differential output signal 342, 344) can be directly related to a value of the drive current 336a. For example, the sensitivity of the Hall effect element 318 (i.e., sensitivity of the differential output signal 342, 344) can vary or change directly with temperature. The sensitivity of the Hall effect element 118 can also vary or change in a way related to stresses upon a substrate in which the Hall effect element 318 is disposed, which stresses may or may not be related to temperature. Thus, the input to amplifier 302 can have a large first and/or second order temperature coefficient, large enough to impact the operation of amplifier 302.

In an embodiment, the resistor 316 can have a particular construction that makes a resistance of the resistor 316 change with stress of the substrate by an amount that generally compensates for changes in the sensitivity of the Hall effect element 318 with regard to stress, essentially by changing the drive current 336a as the stress changes. Changes in resistance of the resistor 316 result in changes in the reference current 314a, which result in changes of the drive current. Thus, the input to amplifier 302 can be compensated to address the changes in the sensitivity of the Hall effect element 318.

However, in some embodiments, the use of resistor 316 may result in a Hall plate sensitivity having a strong negative sensitivity temperature coefficient. Thus, further compensation may be needed. For example, to reduce a first and/or second order temperature coefficient of the Hall effect element 318. For example, and referring to FIG. 4, a plot 400 of the resulting sensitivity of Hall effect element is provided.

In plot 400, each of the y-axis and x-axis correspond to normalized sensitivity values with respect to a change in temperature. In an embodiment, plot 400 may represent a plot of the sensitivity of Hall effect element 118 described above with respect to FIG. 1, Hall effect element 218 described above with respect to FIG. 2, or Hall effect element 318 described above with respect to FIG. 3.

As illustrated in plot 400, the sensitivity of the Hall effect element has a negative first order temperature coefficient and a positive second order temperature coefficient. In some embodiments, to compensate for the large negative first order temperature coefficient, the Hall plate sensitivity can be multiplied by a reference voltage having a temperature coefficient different than zero (e.g., voltage temperature coefficient numerator (VTCN)). For example, a Hall plate sensitivity may be defined as HPSens and a first reference voltage may be VTCN. Thus, a compensated Hall plate sensitivity, CompensatedHPSens, may be defined by the following equations.

$$\text{CompensatedHPSens}=\text{HPSens.}*\text{VTCN} \qquad \text{Equation 1}$$

$$\text{CompensatedHPSens}=\text{HPSens.}*(aT+b) \qquad \text{Equation 2}$$

where aT+b represents a first order function, where a and b represent coefficient values and T represents a temperature value. Thus, the Hall plate sensitivity can be multiplied by a reference voltage having a temperature coefficient different than zero and using a first order function to reduce a first order temperature coefficient of the Hall plate sensitivity.

Figure 5:
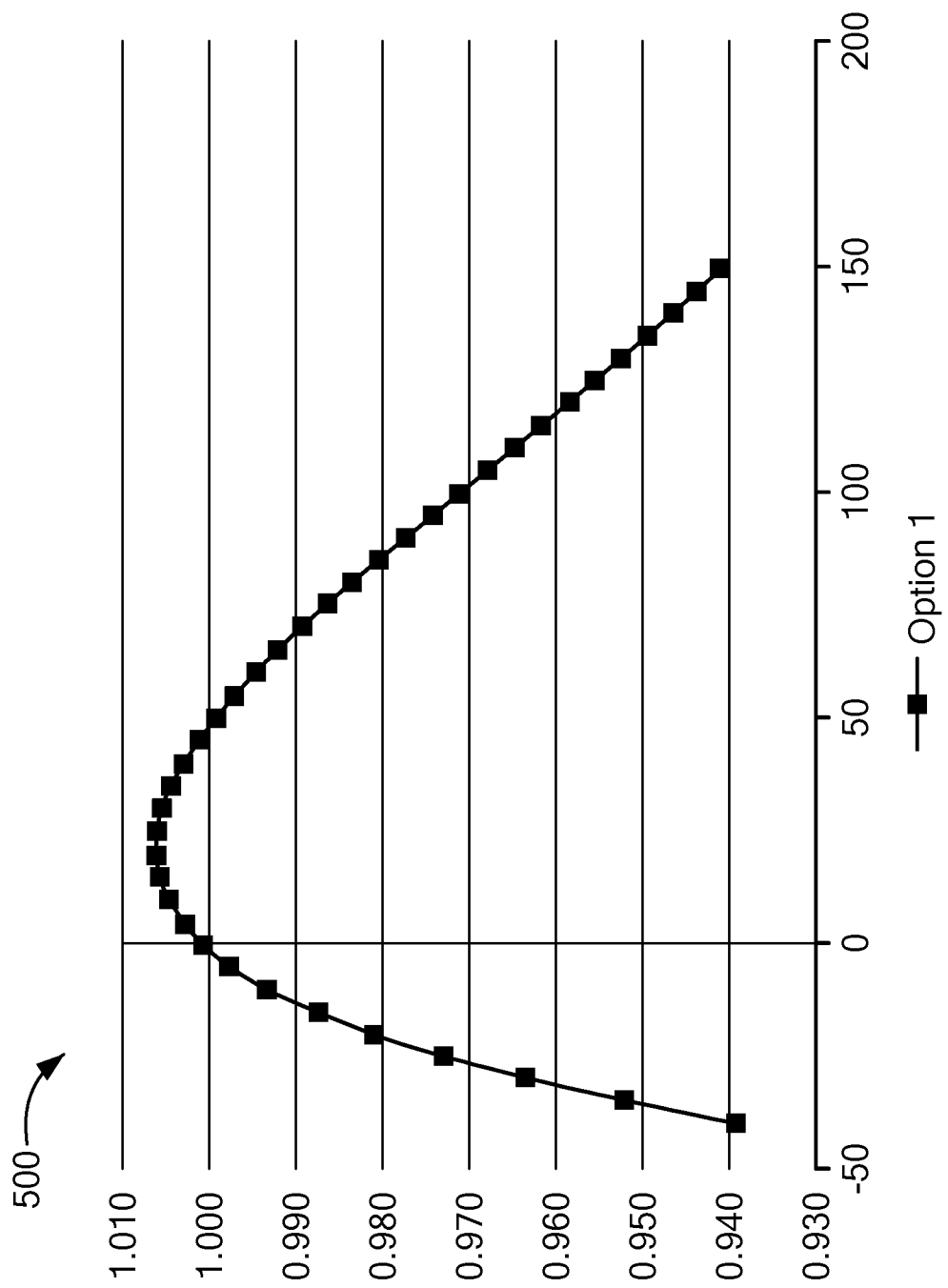
FIG. 5 is a plot of the sensitivity of a Hall effect element compensated with a first voltage reference.

For example, and now referring to FIG. 5, a plot 500 of a sensitivity of Hall effect element that has been compensated by multiplying the Hall plate sensitivity by a reference voltage (e.g., VTCN) is provided. In an embodiment, plot 500 may represent a plot of the sensitivity of Hall effect element 118 described above with respect to FIG. 1, Hall effect element 218 described above with respect to FIG. 2, or Hall effect element 318 described above with respect to FIG. 3, when compensated by multiplying their respective Hall plate sensitivity by a reference voltage (e.g., VTCN).

As illustrated in plot 500, the resulting sensitivity has a smaller first order temperature coefficient. However, in some embodiments, there may be a noticeable negative second order coefficient. For example, if the Hall plate sensitivity is defined as:

$$\text{HPSens}=pT^2-qT+r \qquad \text{Equation 3}$$

where $pT^2$ represents a second order coefficient and $qT$ represents a first order temperature coefficient, with T as a temperature value. Then, using equations 1 and 2 from above, we get a compensated Hall plate sensitivity defined as follows:

$$\text{CompensatedHPSens}=\text{HPSens.}*\text{VTCN} \qquad \text{Equation 4}$$

$$\text{CompensatedHPSens}=(pT^2-qT+r)*(aT+b) \qquad \text{Equation 5}$$

$$\text{CompensatedHPSens}=paT^3+(pb-qa)T^2+ \\ (qb+ra)T+r+b \qquad \text{Equation 6}$$

where $paT^3$ represents a third order coefficient, $(pb-qa)T^2$ represents a second order coefficient and $(qb+ra)T$ represents a first order temperature coefficient, with T as a temperature value. Thus, the term $qa \gg pb$ defines the negative second order coefficient.

In an embodiment, to reduce the negative second order coefficient, a second reference voltage may be generated to produce higher order coefficients. The sensitivity can be divided by the second reference voltage (e.g., voltage temperature coefficient denominator (VTCD)) with a first order temperature coefficient. For example, the Taylor expansion, provided below, shows that higher order numerator coefficients are generated.

$$\frac{1}{cT+d} = \alpha + \beta T + \gamma T^2 + \delta T^3 + \varepsilon T^4 + \zeta T^5 \qquad \text{Equation 7}$$

In an embodiment, by carefully selecting the denominator terms, the second order sensitivity coefficient can be greatly reduced. The systems and methods described herein may use two reference voltages (VTCN, VTCD). Their coefficients can be selected such that they reduce the Hall plate sensitivity variation with temperature. Thus, a new compensated Hall plate sensitivity (NewCompensatedHPSens) may be defined as follows:

VTCN=aT+b (numerator term)      Equation 8

VTCD=−cT+d (denominator term)      Equation 9

NewCompensatedHPSens=HPSens (aT+b)/(−cT+d)      Equation 10 where, VTCN=aT+b represents a first reference voltage and VTCD=−cT+d represents a second reference voltage. In an embodiment, the reference voltages, VTCN and VTCD, can be converted into currents and provided into a front end amplifier's Gilbert cell to generate a multiplication (VTCN) and division (VTCD) with a Hall plate sensitivity signal.

In an embodiment, the reference voltages may be applied to a resistor in each of the circuits described above with respect to FIGs.1-3, (e.g., resistor 224 of FIG. 2, resistor 316 of FIG. 3) to reduce a first and/or second order temperature coefficient of a Hall effect element (e.g., Hall effect element 118 of FIG. 1, Hall effect element 218 of FIG. 2, Hall effect element 318 of FIG. 3). The reference voltage applied to the resistor may generate a current that bias the Hall effect element. In an embodiment, the reference voltages may be generated by a temperature coefficient circuit (e.g., temperature coefficient circuit 120 of FIG. 1, temperature coefficient circuit 220 of FIG. 2, temperature coefficient circuit 320 of FIG. 3 and temperature coefficient circuit 600 of FIG. 6). The temperature coefficient circuit may convert the voltages into currents (e.g., $I_{mul}$ and $I_{div}$) and provide the currents to an input of an amplifier (e.g., amplifier 102 of FIG. 1, amplifier 202 of FIG. 2 and amplifier 302 of FIG. 3).

Figure 6:
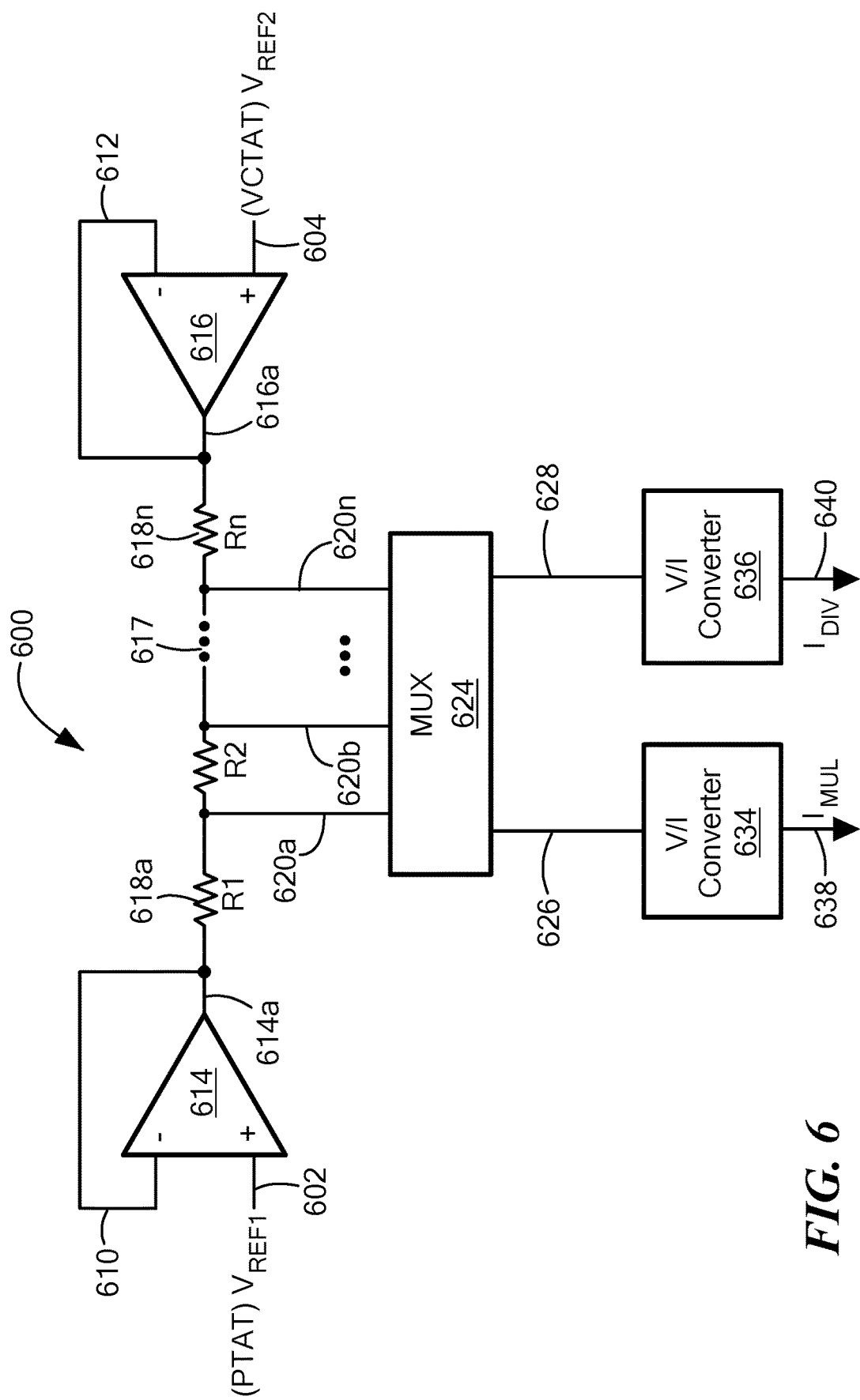
FIG. 6 is a circuit diagram of a temperature compensation circuit.

Now referring to FIG. 6, a temperate coefficient circuit 600 includes a first amplifier 614, a second amplifier 616, a multiplexer (MUX) 624, a first voltage/current (V/I) converter 634 and a second V/I converter 636.

First amplifier 614 can be coupled to receive a first reference voltage 602 at a noninverting terminal. In some embodiments, the reference voltage 602 may be a voltage proportional to absolute temperature (PTAT). First amplifier 614 can generate a first amplifier output 614a. An inverting terminal of first amplifier 614 can be coupled to the first amplifier output 614a (e.g., negative feedback loop). In some embodiments, first amplifier 614 may be an inverting operational amplifier.

Second amplifier 616 can be coupled to receive a second reference voltage 604 at a noninverting terminal. In some embodiments, the second reference voltage 604 may be a voltage complementary to absolute temperature (VCTAT). Second amplifier 616 can generate a second amplifier output 616a. An inverting terminal of second amplifier 616 can be coupled to the second amplifier output 616a (e.g., negative feedback loop). In some embodiments, second amplifier 616 may be an inverting operational amplifier.

First amplifier output 614a may be coupled to second amplifier output 616a through a series of resistors ($R_1$-$R_N$) 618a-618n. The series of resistors 618a-618n may generate different voltages along a signal path 617 between first amplifier output 614a and second amplifier output 616a. For example, a voltage at a point on the signal path 617 between a first two resistors may be different from a voltage at a point on the signal path 617 between a second two resistors. In an embodiment, the series of resistors 618a-618n may include at least two or more resistors.

In an embodiment, a plurality of resistors taps 620a-620n may couple signal path 617 to a plurality of inputs of a multiplexer 624. The plurality of resistor taps 620a-620n provide voltages from the signal path 617 between first amplifier output 614a and second amplifier output 616a to the multiplexer 624. The voltage provided from any of the plurality of resistor taps 620a-620n may depend on a location the respective resistor tap couples to the signal path 617. For example, the voltage may depend on the number of resistors in the series of resistors 618a-618n and a location each of the respective resistor taps couple between the series of resistors 618a-618n. Thus, in an embodiment, a location of one or more of the plurality of resistor tap 620a-620n may depend on a desired voltage to be provided to the inputs of the multiplexer 624. In an embodiment, the number of resistor taps 620a-620n and inputs to the multiplexer 624 may vary based on a particular application of temperate coefficient circuit 600.

In some embodiments, multiplexer 624 may include more multiple multiplexers. For example, multiplexer 624 may include a first multiplexer having one or more input nodes coupled to the series of resistors 618a-618n and a second multiplexer having one or more inputs coupled to the series of resistors 618a-618n. In an embodiment, the first multiplexer may receive one or more voltages from the series of resistors 618a-618n and generate the multiplication reference voltage and the second multiplexer may receive one or more voltages from the series of resistors 618a-618n and generate the division reference voltage.

Multiplexer 624 may receive a voltage from one or more of the plurality of resistor taps 620a-620n. Multiplexer 624 may generate two outputs, a first multiplexer output 626 and a second multiplexer output 628. An input of first V/I converter 634 is coupled to first multiplexer output 626. An input of second V/I converter 636 is coupled to second multiplexer output 628.

In some embodiments, temperature coefficient circuit 600 may not include multiplexer 624. For example, a first resistor tap of the plurality of resistor taps 620a-620n may couple directly to an input of first V/I converter 634 and second resistor tap of the plurality of resistor taps 620a-620n may be coupled directly to an input of second V/I converter 636.

First V/I converter 634 may generate a first V/I converter output 638 and second V/I converter 636 may generate a second V/I converter output 640. In an embodiment, the first and second V/I converter outputs 638, 640 may be provided to amplifier.

In operation, first amplifier 614 may receive the first reference voltage 602 generated in conjunction with a proportional to absolute temperature (PTAT) device. The first reference voltage 602 may have a predetermined non-zero sensitivity to temperature. Thus, the first reference voltage 602 may be sensitive to changes in temperature and vary based on the change in temperature. Second amplifier 616 may receive the second reference voltage 604 (e.g., VCTAT). The second reference voltage 604 may be generated in conjunction with a complementary to absolute temperature (CTAT) device. In an embodiment, the second reference voltage (CTAT) may have an opposite temperature coefficient with respect to the first reference voltage (PTAT).

First amplifier 614 may generate first amplifier output 614a and be coupled to signal path 617 to provide the first amplifier output 614a to a first end of the series of resistors 618a-618n. Second amplifier 616 may generate second amplifier output 616a and be coupled to signal path 617 to provide the second amplifier output 616a to a second end of the series of resistors 618a-618n.

The plurality of resistor taps 620a-620n may be coupled to the signal path 617 to receive (e.g., tap) a voltage at specific points along the series of resistors 618a-618n. The plurality of resistor taps 620a-620n may one or more voltages to input nodes of multiplexer 624.

Multiplexer 624 may receive one or more voltages from the plurality of resistor taps 620a-620n and generate a multiplication reference voltage related to a multiplication factor, a division reference voltage related to a division divisor, or both. In some embodiments, multiplexer 624 may perform calibration on the one or more voltages received from the plurality of resistor taps 620a-620n.

In an embodiment, calibration may not be needed, thus temperature coefficient circuit 600 may not include multiplexer 624. For example, a first resistor tap of the plurality of resistor taps 620a-620n may provide a multiplication reference voltage to an input of first V/I converter 634 and a second resistor tap of the plurality of resistor taps 620a-620n may provide a division reference voltage to an input of second V/I converter 636.

In an embodiment, an input of first V/I converter 634 may be coupled to an output of multiplexer 624 to receive the multiplication reference voltage and an input of second V/I converter 636 may be coupled to an output of multiplexer 624 to receive the division reference voltage. In some embodiments, a buffer (e.g., inverter buffer) may be provided between second multiplexer output 628 and the input of second V/I converter 636 to convert the division reference voltage to a negative voltage. Thus, the second V/I converter 636 may receive a negative division reference voltage.

First V/I converter 634 may generate the first V/I converter output 638. In an embodiment, first V/I converter output 638 may be a current, $I_{mul}$, also referred to herein as a multiplication reference current. Second V/I converter 636 may generate a second V/I converter output 640. In an embodiment, second V/I converter output 640 may be a current, $I_{div}$, also referred to herein as a division reference current.

In an embodiment, temperate coefficient circuit 600 may the same as or substantially similar to temperate coefficient circuit 120 of FIG. 1, temperate coefficient circuit 220 of FIG. 2 and temperate coefficient circuit 320 of FIG. 3. In operation, temperature coefficient circuit 600 may generate two reference voltages and convert them into currents, $I_{mul}$ and $I_{div}$, and provide them to an input of an amplifier (e.g., amplifier 102 of FIG. 1, amplifier 202 of FIG. 2 and amplifier 302 of FIG. 3). For example, in one embodiment, currents, $I_{mul}$ and $I_{div}$, may be provided to a front end amplifier's Gilbert cell to generate multiplication (VTCN) and division (VTCD) with a Hall plate sensitivity signal to reduce a first and/or second order Hall plate sensitivity temperature coefficient.

Figure 7:
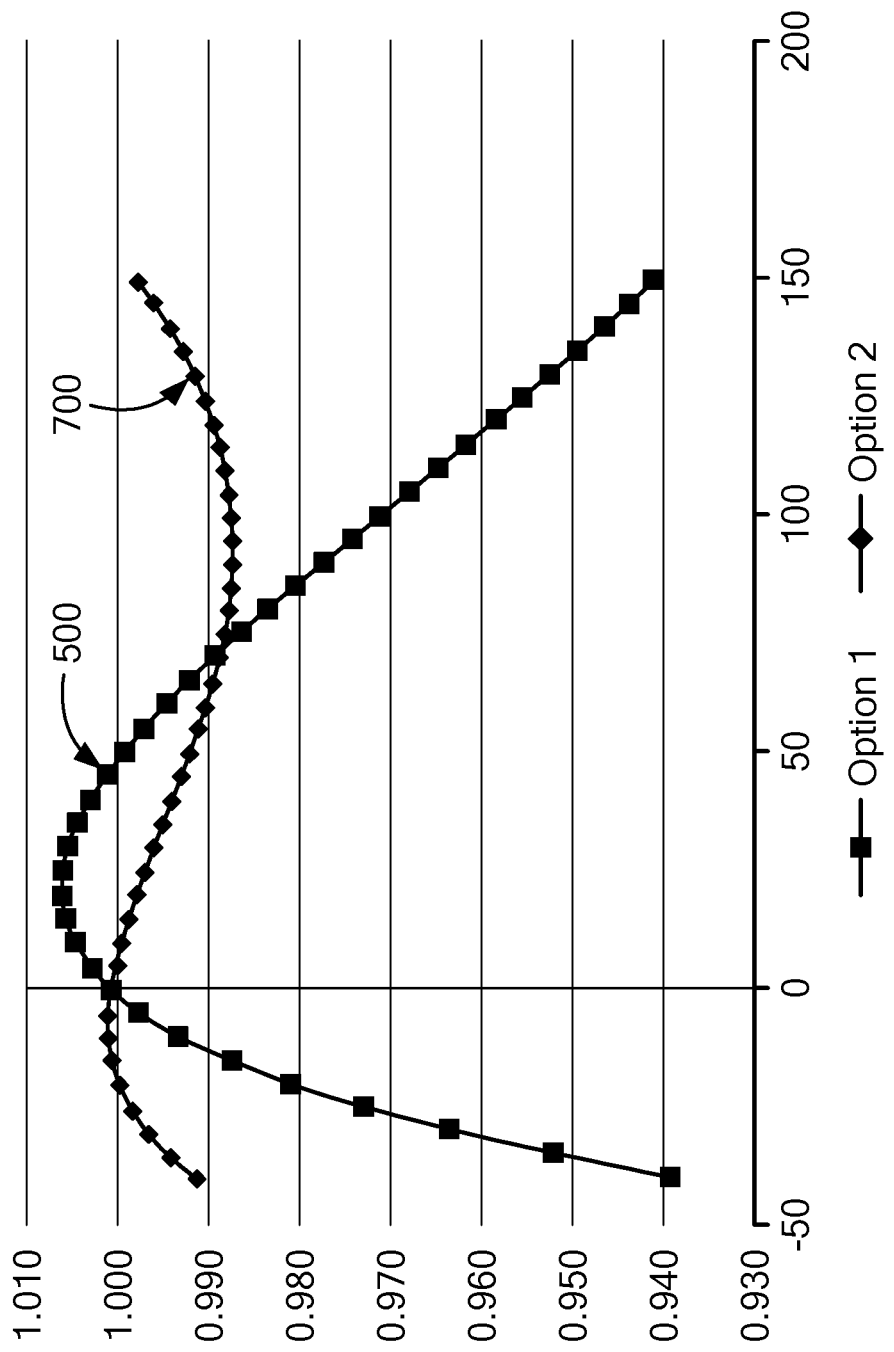
FIG. 7 is a plot of the sensitivity of a Hall effect element compensated with a first and second voltage references.

For example and now referring to FIG. 7, a plot 700 of a sensitivity of Hall effect element that has been compensated by multiplying the Hall plate sensitivity by a first reference voltage (e.g., VTCN) and dividing the Hall plate sensitivity by a second reference voltage (e.g., VTCD) is compared to the plot 500 from FIG. 5, of a Hall effect element that has only been compensated by multiplying the Hall plate sensitivity by a first reference voltage (e.g., VTCN). As illustrated in FIG. 7, the variation of sensitivity with respect to temperature (e.g., variation in change of the plot 700) has been greatly reduced in comparison to plot 500 (or plot 400 of FIG. 4). Thus, by selecting appropriate numerator terms (VTCN), a first order temperature coefficient can be reduced and by selecting appropriate denominator terms (VTCD), second order temperature coefficient can be reduced.

In an embodiment, plot 700 may represent a plot of the sensitivity of Hall effect element 118 described above with respect to FIG. 1, Hall effect element 218 described above with respect to FIG. 2, or Hall effect element 318 described above with respect to FIG. 3, when compensated by multiplying their respective Hall plate sensitivity by a reference voltage (e.g., VTCN).

While the concepts, systems and techniques sought to be protected have been particularly shown and described with references to illustrated embodiments thereof, it will be understood by those skilled in the art that various changes in form and details may be made therein without departing from the spirit and scope of the concepts as defined by the appended claims. For instance, the apparatus described herein is applicable from low RF frequencies to high microwave frequencies. Further, the concepts, systems and techniques described herein are applicable to installation on towers, in buildings, and on vehicles such as ground moving vehicles, airborne vehicles, and satellites. Further, the concepts, systems and techniques described herein are applicable to handheld or backpack antenna applications for search and rescue.

Elements of different embodiments described herein may be combined to form other embodiments not specifically set forth above. Other embodiments not specifically described herein are also within the scope of the following claims.

What is claimed is:
1. A circuit comprising:
    a first amplifier to receive a first reference voltage generated in conjunction with a proportional to absolute temperature (PTAT) device, the first amplifier having a first output node;
    a second amplifier to receive a second reference voltage generated in conjunction with a complementary to absolute temperature (CTAT) device, the second amplifier having a second output node;
    a plurality of resistors disposed in a signal path between the first output node and the second output node, the plurality of resistors having at least one resistor tap;
    at least one voltage-to-current converter coupled to the at least one resistor tap, the at least one voltage-to-current converter to generate a respective at least one current signal; and a third amplifier, the third amplifier coupled to the at least one current signal, the at least one current signal operable to apply a multiplication factor or a division divisor to the third amplifier.

2. The circuit of claims 1, wherein the at least one resistor tap comprises a plurality of resistor taps, wherein the at least one voltage-to-current converter comprises a plurality of voltage-to-current converters, wherein the circuit further comprises:
a multiplexer coupled between the plurality of resistors and the plurality of voltage-to-current converters, the multiplexer having a plurality of input nodes coupled to the plurality of resistor taps, the plurality of multiplexers having a plurality of output nodes, wherein the multiplexer receives one or more voltages from the plurality of resistor taps and generates a multiplication reference voltage related to the multiplication factor and a division reference voltage related to the division divisor.

3. The circuit of claim 1, wherein the first reference voltage is coupled to a noninverting terminal of the first amplifier.

4. The circuit of claim 1, wherein the second reference voltage is coupled to a noninverting terminal of the second amplifier.

5. The circuit of claim 2, wherein the multiplexer comprises:
a first multiplexer having one or more input nodes coupled to the plurality of resistors; and
a second multiplexer having one or more inputs coupled to the plurality of resistors;
wherein the first multiplexer receives one or more voltages from the plurality of resistors and generates the multiplication reference voltage and the second multiplexer receives one or more voltages from the plurality of resistors and generates the division reference voltage.

6. The circuit of claim 2, further comprising a first converter coupled to the multiplexer, wherein the first converter receives the multiplication reference voltage and generates a multiplication reference current.

7. The circuit of claim 1, wherein the first reference voltage has a predetermined non-zero sensitivity to temperature.

8. The circuit of claim 1, wherein the first and second amplifiers comprise respective noninverting operational amplifiers.

9. A circuit comprising:
a first amplifier to receive a first reference voltage generated in conjunction with a first device, the first amplifier having a first output node;
a second amplifier to receive a second reference voltage generated in conjunction with a second device, the second amplifier having a second output node;
a plurality of resistors disposed in a signal path between the first output node and the second output node, the plurality of resistors having at least one resistor tap;
at least one voltage-to-current converter coupled to the at least one resistor tap, the at least one voltage-to-current converter to generate a respective at least one current signal; and
a third amplifier, the third amplifier coupled to the at least one current signal, the at least one current signal operable to apply a multiplication factor or a division divisor to the third amplifier.

10. The circuit of claim 9, wherein the first device is a proportional to absolute temperature (PTAT) device.

11. The circuit of claim 9, wherein the second device is a complementary to absolute temperature (CTAT) device.

12. The circuit of claim 9, wherein the at least one resistor tap comprises a plurality of resistor taps, wherein the at least one voltage-to-current converter comprises a plurality of voltage-to-current converters, wherein the circuit further comprises:
a multiplexer coupled between the plurality of resistors and the plurality of voltage-to-current converters, the multiplexer having a plurality of input nodes coupled to the plurality of resistor taps, the plurality of multiplexers having a plurality of output nodes, wherein the multiplexer receives one or more voltages from the plurality of resistor taps and generates a multiplication reference voltage related to the multiplication factor and a division reference voltage related to the division divisor.

13. The circuit of claim 9, wherein the first reference voltage is coupled to a noninverting terminal of the first amplifier.

14. The circuit of claim 9, wherein the second reference voltage is coupled to a noninverting terminal of the second amplifier.

15. The circuit of claim 12, wherein the multiplexer comprises:
a first multiplexer having one or more input nodes coupled to the plurality of resistors; and
a second multiplexer having one or more inputs coupled to the plurality of resistors;
wherein the first multiplexer receives one or more voltages from the plurality of resistors and generates the multiplication reference voltage and the second multiplexer receives one or more voltages from the plurality of resistors and generates the division reference voltage.

16. The circuit of claim 12, further comprising a first converter coupled to the multiplexer, wherein the first converter receives the multiplication reference voltage and generates a multiplication reference current.

17. The circuit of claim 9, wherein the first reference voltage has a predetermined non-zero sensitivity to temperature.

18. The circuit of claim 9, wherein the first and second amplifiers comprise respective noninverting operational amplifiers.

19. A circuit comprising
a first amplifier to receive a first reference voltage generated in conjunction with a first device, the first amplifier having a first output node;
a second amplifier to receive a second reference voltage generated in conjunction with a second device, the second amplifier having a second output node;
a plurality of resistors disposed in a signal path between the first output node and the second output node, the plurality of resistors having at least one resistor tap; and
at least one voltage-to-current converter coupled to the at least one resistor tap, the at least one voltage-to-current converter to generate a respective at least one current signal.

20. The circuit of claim 19,
wherein the at least one current signal is operable to apply a multiplication factor or a division divisor.

* * * * *

UNITED STATES PATENT AND TRADEMARK OFFICE
CERTIFICATE OF CORRECTION

PATENT NO. : 10,746,818 B2
APPLICATION NO. : 16/156104
DATED : August 18, 2020
INVENTOR(S) : Juan Manuel Cesaretti It is certified that error appears in the above-identified patent and that said Letters Patent is hereby corrected as shown below:

On the Title Page

Item (57) ABSTRACT, Line 10 delete "between output" and replace with --between an output--.

Item (57) ABSTRACT, Line 13 delete "resistors taps" and replace with --resistor taps--.

In the Specification

Column 1, Line 31 delete "related an" and replace with --related to an--.

Column 2, Line 61 delete "coefficient; and" and replace with --coefficient.--.

Column 3, Line 17 delete "though" and replace with --through--.

Column 3, Line 20 delete "element passes between" and replace with --element between--.

Column 3, Line 55 delete "provide" and replace with --provided--.

Column 4, Line 6 delete "from Hall" and replace with --from the Hall--.

Column 4, Line 15-16 delete "to the amplifier to the amplifier" and replace with --to the amplifier--.

Column 7, Line 34 delete "component" as" and replace with --component" is--.

Column 7, Line 67 delete "(i.e., ions)" and replace with --(i.e., ions).--.

Column 9, Line 26 delete "108, an also" and replace with --108, and also--.

Column 10, Line 33 delete "216a, an also" and replace with --216a, and also--.

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,746,818 B2

Column 11, Line 4 delete "that and be" and replace with --that can be--.

Column 12, Line 35 delete "provided to into" and replace with --provided to--.

Column 13, Line 11 delete "", an also" and replace with --, and also--.

Column 15, Line 58 delete "temperate" and replace with --temperature--.

Column 16, Line 23 delete "resistors taps" and replace with --resistor taps--.

Column 16, Line 35 delete "resistor tap" and replace with --resistor taps--.

Column 16, Line 39 delete "temperate" and replace with --temperature--.

Column 17, Line 3 delete "to amplifier" and replace with --to an amplifier--.

Column 17, Line 27 delete "may one" and replace with --may provide one--.

Column 17, Line 62 delete ", temperate" and replace with --, temperature--.

Column 17, Line 62-63 delete "may the" and replace with --may be the--.

Column 17, Line 63 delete "temperate" and replace with --temperature--.

Column 17, Line 64 delete ", temperate" and replace with --, temperature--.

Column 17, Line 65 delete "temperate" and replace with --temperature--.

In the Claims

Column 19, Line 5 delete "claims 1," and replace with --claim 1,--.